US011221661B2

(12) United States Patent
Nagabhairava et al.

(10) Patent No.: US 11,221,661 B2
(45) Date of Patent: Jan. 11, 2022

(54) METHOD FOR AUTO-DISCOVERY AND CATEGORIZATION OF A PLANTS POWER AND ENERGY SMART DEVICES FOR ANALYTICS

(71) Applicant: Rockwell Automation Technologies, Inc., Mayfield Heights, OH (US)

(72) Inventors: Mithun Mohan Nagabhairava, Brookfield, WI (US); Alex L. Nicoll, Brookfield, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 76 days.

(21) Appl. No.: 16/247,021

(22) Filed: Jan. 14, 2019

(65) Prior Publication Data

US 2020/0225725 A1    Jul. 16, 2020

(51) Int. Cl.
*G06F 1/3206*    (2019.01)
*G06F 16/28*    (2019.01)
(Continued)

(52) U.S. Cl.
CPC .............. *G06F 1/3206* (2013.01); *G06F 1/28* (2013.01); *G06F 16/248* (2019.01); *G06F 16/287* (2019.01)

(58) Field of Classification Search
CPC ......... G06F 16/287; G06F 16/248; G06F 1/28
See application file for complete search history.

(56) References Cited

U.S. PATENT DOCUMENTS 5,909,548 A    6/1999 Klein et al.
6,006,171 A    12/1999 Vines et al.
(Continued)

FOREIGN PATENT DOCUMENTS

| CN | 101963799 A | 2/2011 |
|---|---|---|
| CN | 103578039 A | 2/2014 |
| EP | 3018597 A1 | 5/2016 |

OTHER PUBLICATIONS

Notice of Allowance received for U.S. Appl. No. 15/672,851 dated Mar. 2, 2020, 36 pages.
Non-Final Office Action received for U.S. Appl. No. 16/403,770 dated Feb. 20, 2020, 42 pages.
Non-Final Office Action received for U.S. Appl. No. 15/672,851 dated Oct. 29, 2019, 57 pages.
(Continued)

*Primary Examiner* — Mohammed H Rehman
*Assistant Examiner* — Hyun Soo Kim
(74) *Attorney, Agent, or Firm* — Amin, Turocy & Watson, LLP

(57) ABSTRACT

A power device discovery and visualization system identifies and categorizes smart power and energy devices deployed within an industrial enterprise, and generates interfaces that render customized presentations of a plant's power and energy usage based on data retrieved from the discovered devices. The system also facilitates remote configuration of the discovered smart devices via interaction with a single consolidated interface that affords access to all discovered power and energy devices. The system constructs a device profile for each discovered smart device based on information retrieved from the device, and categorizes each discovered device according to device type (e.g., power meter, IED, VFD, controller, etc.). The system retrieves available historical, real-time, and/or configuration data from each discovered smart device and makes this data available for viewing or modification via the system interface, thereby unifying plantwide power and energy data into a common presentation.

20 Claims, 22 Drawing Sheets

(51) Int. Cl.
*G06F 16/248* (2019.01)
*G06F 1/28* (2006.01)

(56) References Cited

U.S. PATENT DOCUMENTS

| | | | |
|---|---|---|---|
| 6,618,856 B2 | 9/2003 | Coburn et al. | |
| 7,117,043 B1 | 10/2006 | Frederick et al. | |
| 8,285,744 B2 | 10/2012 | Dorgelo et al. | |
| 8,438,192 B2 | 5/2013 | Obitko et al. | |
| 9,110,972 B2 * | 8/2015 | Hamdi | G06F 11/3062 |
| 2002/0087419 A1 | 7/2002 | Andersson et al. | |
| 2003/0079224 A1 | 4/2003 | Komar et al. | |
| 2004/0236620 A1 | 11/2004 | Chauhan et al. | |
| 2006/0177119 A1 | 8/2006 | McPheely et al. | |
| 2007/0078824 A1 | 4/2007 | Dorgelo et al. | |
| 2007/0251988 A1 | 11/2007 | Ahsan et al. | |
| 2008/0016146 A1 | 1/2008 | Gan et al. | |
| 2008/0082577 A1 | 4/2008 | Hood et al. | |
| 2008/0208368 A1 | 8/2008 | Grgic | |
| 2008/0288321 A1 | 11/2008 | Dillon et al. | |
| 2008/0307523 A1 | 12/2008 | Subramanyam et al. | |
| 2009/0077055 A1 | 3/2009 | Dillon et al. | |
| 2009/0083649 A1 | 3/2009 | Baier et al. | |
| 2009/0086021 A1 | 4/2009 | Baier et al. | |
| 2009/0327483 A1 | 12/2009 | Thompson et al. | |
| 2010/0049574 A1 | 2/2010 | Paul et al. | |
| 2010/0082669 A1 | 4/2010 | Obitko et al. | |
| 2010/0161835 A1 | 6/2010 | Syed et al. | |
| 2010/0191487 A1 * | 7/2010 | Rada | G05F 1/70 702/60 |
| 2010/0256795 A1 | 10/2010 | McLaughlin et al. | |
| 2011/0022198 A1 | 1/2011 | Plache et al. | |
| 2011/0150431 A1 * | 6/2011 | Klappert | G06F 1/3234 386/296 |
| 2011/0261186 A1 | 10/2011 | Blackburn et al. | |
| 2012/0112893 A1 | 5/2012 | Bezdicek et al. | |
| 2012/0194502 A1 | 8/2012 | Smith et al. | |
| 2012/0240049 A1 | 9/2012 | Britt et al. | |
| 2012/0242648 A1 | 9/2012 | Baier et al. | |
| 2012/0278015 A1 * | 11/2012 | Budhraja | H02J 13/00034 702/62 |
| 2013/0006395 A1 | 1/2013 | Plache et al. | |
| 2013/0123965 A1 | 5/2013 | Cooper et al. | |
| 2013/0124186 A1 | 5/2013 | Donabedian et al. | |
| 2013/0124253 A1 | 5/2013 | Cooper et al. | |
| 2013/0124465 A1 | 5/2013 | Pingel et al. | |
| 2013/0185006 A1 * | 7/2013 | Schwager | G01R 29/26 702/58 |
| 2013/0211559 A1 | 8/2013 | Lawson et al. | |
| 2013/0212160 A1 | 8/2013 | Lawson et al. | |
| 2013/0212420 A1 | 8/2013 | Lawson et al. | |
| 2013/0290374 A1 | 10/2013 | Chand et al. | |
| 2013/0297060 A1 | 11/2013 | Sundling, Jr. et al. | |
| 2013/0325541 A1 | 12/2013 | Capriotti et al. | |
| 2014/0019461 A1 * | 1/2014 | Bredenberg | G06F 9/451 707/754 |
| 2014/0277593 A1 | 9/2014 | Nixon et al. | |
| 2014/0316540 A1 | 10/2014 | Loncar et al. | |
| 2014/0336791 A1 | 11/2014 | Asenjo et al. | |
| 2014/0358601 A1 | 12/2014 | Smiley et al. | |
| 2015/0116482 A1 | 4/2015 | Bronmark et al. | |
| 2015/0213838 A1 | 7/2015 | Dinev et al. | |
| 2015/0293530 A1 | 10/2015 | Haskell et al. | |
| 2015/0316904 A1 * | 11/2015 | Govindaraj | G05B 19/0421 700/28 |
| 2016/0127712 A1 | 5/2016 | Alfredsson et al. | |
| 2016/0132538 A1 | 5/2016 | Bliss et al. | |
| 2016/0274558 A1 | 9/2016 | Strohmenger et al. | |
| 2016/0282872 A1 | 9/2016 | Ahmed et al. | |
| 2016/0292895 A1 | 10/2016 | Billi et al. | |
| 2017/0085084 A1 * | 3/2017 | Daly | G05B 15/02 |
| 2017/0351226 A1 | 12/2017 | Bliss et al. | |
| 2017/0371305 A1 * | 12/2017 | Tiwari | G05B 9/02 |
| 2018/0300437 A1 * | 10/2018 | Thomsen | G06F 40/117 |
| 2018/0357334 A1 | 12/2018 | Chao et al. | |
| 2020/0052482 A1 * | 2/2020 | Ostrovsky | H02H 1/0061 |

OTHER PUBLICATIONS

Marshall et al., "In Search of More Meaningful Search", Serials Review, vol. 32, No. 3, Sep. 2006, pp. 172-180.
Extended European Search Report received for European Patent Application No. 15193628.3 dated Mar. 24, 2016, 9 pages.
Extended European Search Report received for European Patent Application No. 15193678.8 dated Mar. 24, 2016, 10 pages.
Communication pursuant to Rule 69 EPC received for European Patent Application Serial No. 15193628.3 dated May 17, 2016, 2 pages.
Communication pursuant to Rule 69 EPC received for European Patent Application Serial No. 15193678.8 dated May 17, 2016, 2 pages.
Non-Final Office Action received for U.S. Appl. No. 14/536,490 dated Nov. 1, 2016, 39 pages.
Non-Final Office Action received for U.S. Appl. No. 14/536,504 dated Nov. 30, 2016, 33 pages.
Final Office Action received for U.S. Appl. No. 14/536,490 dated Mar. 15, 2017, 44 pages.
Notice of Allowance received for U.S. Appl. No. 14/536,490 dated May 12, 2017, 24 pages.
Final Office Action received for U.S. Appl. No. 14/536,504 dated Jul. 13, 2017, 63 pages.
Non-Final Office Action received for U.S. Appl. No. 14/536,504 dated Nov. 3, 2017, 40 pages.
Non-Final Office Action received for U.S. Appl. No. 15/132,376 dated Dec. 11, 2017, 46 pages.
First Office Action received for Chinese Application Serial No. 201510757657.7 dated Nov. 1, 2017, 15 pages (Including English Translation).
Communication pursuant to Rule 94 EPC for EP Patent Application Serial No. 15193678.8 dated Apr. 13, 2018, 8 pages.
Final Office Action received for U.S. Appl. No. 14/536,504 dated Apr. 24, 2018, 48 pages.
Final Office Action received for U.S. Appl. No. 15/132,376 dated May 21, 2018, 32 pages.
Search Report received for Chinese Application Serial No. 201510756437.2 dated Jun. 25, 2018, 2 pages.
Communication pursuant to Article 94(3) EPC for European Application Serial No. 15193628.3 dated May 7, 2018, 12 pages.
Non-Final Office Action received for U.S. Appl. No. 15/132,376 dated Sep. 5, 2018, 41 pages.
Third Office Action received for Chinese Patent Application Serial No. 201510757657.7 dated Oct. 24, 2018, 7 pages (Including English Translation).
First Office Action received for Chinese Application Serial No. 201510756437.2 dated Jul. 3, 2018, 29 pages (Including English Translation).
Extended European Search Report for European Application No. 20151378.5 dated Jun. 8, 2020, 10 pages.

* cited by examiner

| # | Description | Type | Device Name | IP Address | Firmware Version | Firmware Status |
|---|---|---|---|---|---|---|
| 1 | PowerFlex 755TR | Drive | | 10.91.96.124 | 1.1 | ● |
| 2 | PowerFlex 755 | Drive | | 10.91.48.196 | 13.3 | ○ |
| 3 | PowerFlex 755 | Drive | | 10.91.48.199 | 13.3 | ○ |
| 4 | PowerFlex 755 | Drive | | 10.91.20.83 | 13.2 | ○ |
| 5 | PowerFlex 755 | Drive | | 10.91.20.71 | 11.1 | ○ |
| 6 | PowerFlex 755 | Drive | | 10.91.20.82 | 13.2 | ○ |
| 7 | PowerFlex 755TR | Drive | | 10.91.96.79 | 1.1 | ● |
| 8 | PowerFlex 755TR | Drive | | 10.91.96.223 | 3.2 | ● |
| 9 | PowerFlex 755TM | Drive | | 10.91.98.27 | 2.1 | ● |
| 10 | PowerFlex 755TM | Drive | | 10.91.99.177 | 1.1 | ● |
| 11 | PowerFlex 755TR | Drive | | 10.91.100.75 | 2.1 | ● |
| 12 | PowerFlex 755TR | Drive | | 10.91.96.69 | 2.1 | ● |
| 13 | PowerFlex 755TM | Drive | | 10.91.99.12 | 2.1 | ● |
| 14 | PowerFlex 755 | Drive | | 10.91.97.83 | 14.1 | ○ |

FIG. 11

METHOD FOR AUTO-DISCOVERY AND CATEGORIZATION OF A PLANTS POWER AND ENERGY SMART DEVICES FOR ANALYTICS

BACKGROUND

The subject matter disclosed herein relates generally to industrial data management, and, more particularly, to discovery and management of smart power and energy devices.

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, a system for cataloguing smart power and energy devices is provided, comprising a discovery component configured to discover smart power and energy devices deployed on a network and retrieve, for each device of the smart power and energy devices, device information comprising an identity of the device and identities of data tags available on the device; a classification component configured to, for each device of the smart power and energy devices, identify a type of the device, generate a device profile for the device, and classify the device profile according to the type of the device to yield categorized power data; and a client interface component configured to generate an interface display that renders selected sets of the categorized power data in accordance with search input submitted via the interface display.

Also, one or more embodiments provide a method for collecting and rendering smart power and energy device information, comprising identifying, by a system comprising a processor, smart power and energy devices residing on a network; for each device of the smart power and energy devices, retrieving, by the system, device information comprising an identity of the device and identities of data tags available on the device; for each device of the smart power and energy devices, determining, by the system, a type of the device; generating, by the system, a device profile for the device; classifying, by the system, the device profile according to the type of the device to yield categorized power data; and generating, by the system, an interface display that renders selected sets of the categorized power data in accordance with search input submitted via the interface display.

Also, according to one or more embodiments, a non-transitory computer-readable medium is provided having stored thereon instructions that, in response to execution, cause a system to perform operations, the operations, comprising detecting and identifying smart power and energy devices present on a network; retrieving device information from the smart power and energy devices, the device information comprising, for each device of the smart power and energy devices, an identity of the device and identities of data tags available on the device; for each device of the smart power and energy devices: determining a type of the device, generating a device profile for the device, and classifying the device profile according to the type of the device to yield categorized power data; and rendering an interface display that displays selected sets of the categorized power data in accordance with search input submitted via interaction with the interface display.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIG. 11 is an example device profile interface display that can be rendered when a variable frequency drives device selection button is selected.

DETAILED DESCRIPTION

Figure 1:
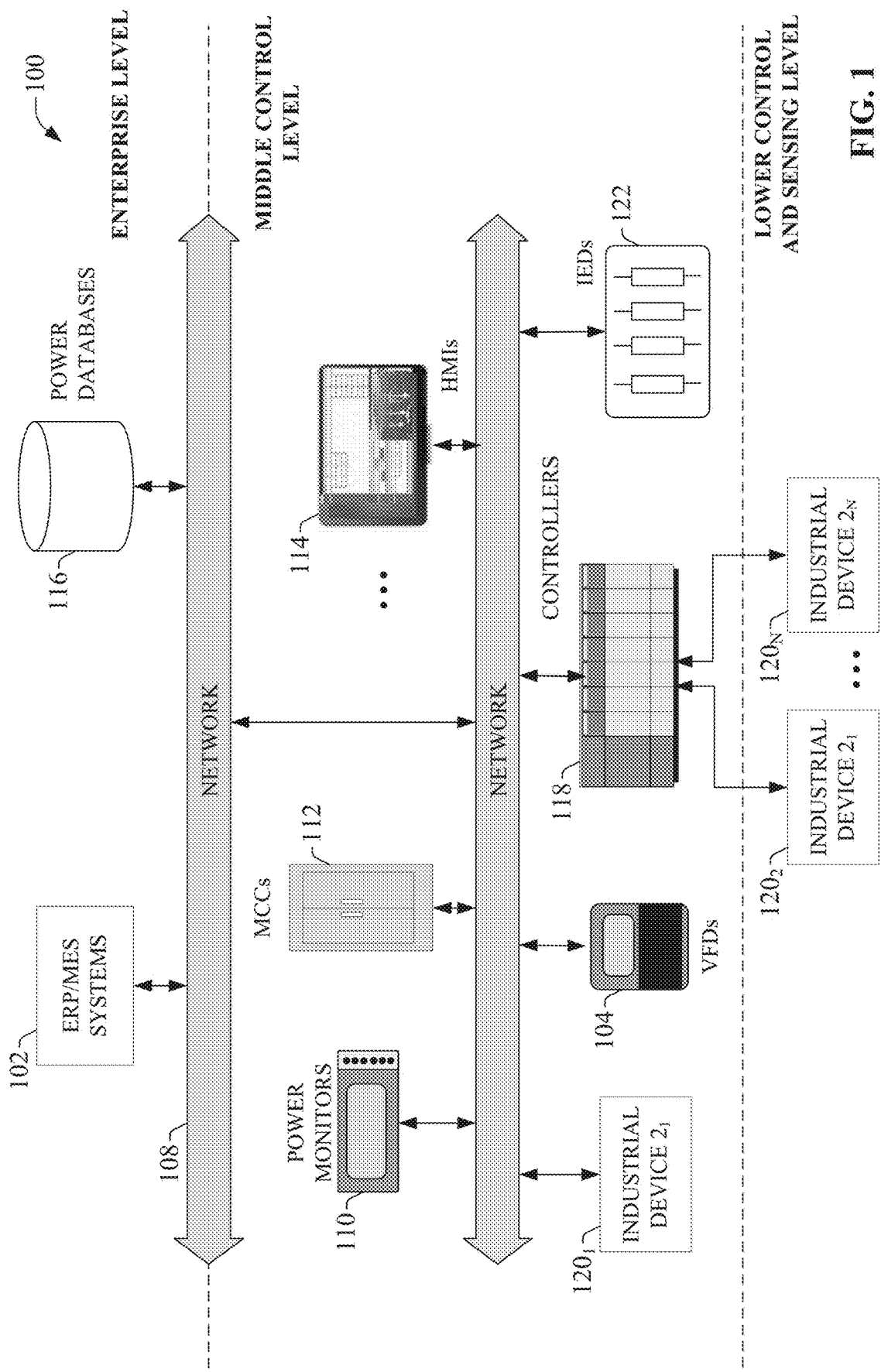
FIG. 1 is a block diagram of an example industrial control environment.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

FIG. 1 is a block diagram of an example industrial control environment 100. In a typical industrial facility, a number of industrial controllers 118 are deployed throughout the facility to monitor and control respective industrial systems or processes relating to product manufacture, machining, motion control, batch processing, material handling, or other such industrial functions. Industrial controllers 118 typically execute respective control programs to facilitate monitoring and control of industrial devices 120 making up the controlled industrial systems. Some industrial controllers 118 may also comprise soft controllers that execute on a personal computer or other hardware platform, or on a cloud platform. Some hybrid devices may also combine controller functionality with other functions (e.g., visualization). The control programs executed by industrial controllers 118 can comprise any conceivable type of code used to process input signals read from the industrial devices 120 and to control output signals generated by the industrial controllers, including but not limited to ladder logic, sequential function charts, function block diagrams, or structured text.

Industrial devices 120 may include both input devices that provide data relating to the controlled industrial systems to the industrial controllers 118, and output devices that respond to control signals generated by the industrial controllers 118 to control aspects of the industrial systems. Example input devices can include telemetry devices (e.g., temperature sensors, flow meters, level sensors, pressure sensors, etc.), manual operator control devices (e.g., push buttons, selector switches, etc.), safety monitoring devices (e.g., safety mats, safety pull cords, light curtains, etc.), and other such devices. Output devices may include motor drives, pneumatic actuators, signaling devices, robot control inputs, valves, and the like.

Industrial controllers 118 may communicatively interface with industrial devices 120 over hardwired or networked connections. For example, industrial controllers 118 can be equipped with native hardwired inputs and outputs that communicate with industrial devices $120_2$-$120_N$ to effect control of the devices. The native controller I/O can include digital I/O that transmits and receives discrete voltage signals to and from the field devices, or analog I/O that transmits and receives analog voltage or current signals to and from the devices. The controller I/O can communicate with a controller's processor over a backplane such that the digital and analog signals can be read into and controlled by the control programs. Some industrial controllers 118 can also communicate with industrial devices 120 (e.g., networked industrial device $120_1$) over a network 108 using, for example, a communication module or an integrated networking port. Example networks can include the Internet, intranets, Ethernet, DeviceNet, ControlNet, Data Highway and Data Highway Plus (DH/DH+), Remote I/O, Fieldbus, Modbus, Profibus, wireless networks, serial protocols, and the like. The industrial controllers 118 can also store persisted data values that can be referenced by the control program and used for control decisions, including but not limited to measured or calculated values representing operational states of a controlled machine or process (e.g., tank levels, positions, alarms, etc.) or captured time series data that is collected during operation of the automation system (e.g., status information for multiple points in time, diagnostic occurrences, etc.). Similarly, some intelligent devices—including but not limited to motor drives, instruments, power monitors, or condition monitoring modules—may store data values that are used for control and/or to visualize states of operation. Such devices may also capture time-series data or events on a log for later retrieval and viewing.

Industrial automation systems often include one or more human-machine interfaces (HMIs) 114 that allow plant personnel to view telemetry and status data associated with the automation systems, and to control some aspects of system operation. HMIs 114 may communicate with one or more of the industrial controllers 118 over the plant network 108, and exchange data with the industrial controllers 118 to facilitate visualization of information relating to the controlled industrial processes on one or more pre-developed operator interface screens. HMIs 114 can also be configured to allow operators to submit data to specified data tags or memory addresses of the industrial controllers 118, thereby providing a means for operators to issue commands to the controlled systems (e.g., cycle start commands, device actuation commands, etc.), to modify setpoint values, etc. HMIs 114 can generate one or more display screens through which the operator interacts with the industrial controllers 118, and thereby with the controlled processes and/or systems. Example display screens can visualize present states of industrial systems or their associated devices using graphical representations of the processes that display metered or calculated values, employ color or position animations based on state, render alarm notifications, or employ other such techniques for presenting relevant data to the operator. Data presented in this manner is read from industrial controllers 118 by HMIs 114 and presented on one or more of the display screens according to display formats chosen by the HMI developer. HMIs may comprise fixed location or mobile devices with either user-installed or pre-installed operating systems, and either user-installed or pre-installed graphical application software.

The industrial enterprise may also include an enterprise resource planning (ERP) or manufacturing execution system 102 that provides high-level performance and business tracking.

In addition to the devices and systems discussed above, many industrial facilities employ a variety of smart devices that monitor and record power and energy utilization throughout the facility. These smart power devices include, for example, power monitors 110 that measure and record power consumed by industrial machines or by areas of the plant facility. Smart power devices can also include intelligent electronic devices (IEDs) 122 that distribute power to industrial equipment in a protected manner IEDs 122—which can be, for example, intelligently controlled circuit breakers, overload relays, capacitor bank switches, load tap changer controllers, or other such devices—can record their own monitored power statistics and device status information (e.g., voltages and/or currents over time, records of power system events such as circuit breaker trips, etc.), and thus serve as another source of power and energy data for the plant. Some variable frequency drives (VFDs) 104, which control the speed of motors by regulating power delivered to the motors, can also store their power statistics locally for subsequent retrieval and viewing. Other sources of power and energy data within an industrial plant environment can include, but are not limited to, smart meters that are integrated with industrial controllers 118, databases 116 (e.g., structured query language (SQL) databases, spreadsheets, or other types of databases) that archive historical power and energy usage data, motor control devices that are part of motor control centers (MCCs) 112, and other such data sources.

Typically, smart power and energy devices must be individually configured manually using energy management software applications. Consequently, while the breadth and diversity of these smart devices can afford useful views into an industrial facility's power and energy usage at various levels of the industrial enterprise, configuring these smart devices to provide the desired views can be a time-consuming and error-prone process, particularly in plants that utilize large numbers of energy meters or other smart power devices.

To address these and other issues, one or more embodiments of the present disclosure provide a power device discovery and visualization system that identifies and categorizes smart power and energy devices deployed within an industrial enterprise, and generates interfaces that render customized presentations of a plant's power and energy usage based on data retrieved from the discovered devices. The discovery and visualization system also facilitates remote configuration of the discovered smart devices via interaction with a single consolidated interface that affords access to all discovered power and energy devices.

In some embodiments, the discovery and visualization system can accept, as input, network parameters defining a range of network addresses to be searched. In response, the system identifies smart power and energy devices within the indicated range of network addresses, constructs a device profile for each discovered smart device based on information retrieved from the device, and categorizes each discovered device according to device type (e.g., power meter, IED, VFD, controller, etc.). The system retrieves available historical, real-time, and/or configuration data from each discovered smart device and makes this data available for viewing or modification via the system interface, thereby unifying plantwide power and energy data into a common presentation. The system provides a means for users to discover and interact with smart power and energy device parameters and tags in less time relative to conventional smart device configuration techniques.

Figure 2:
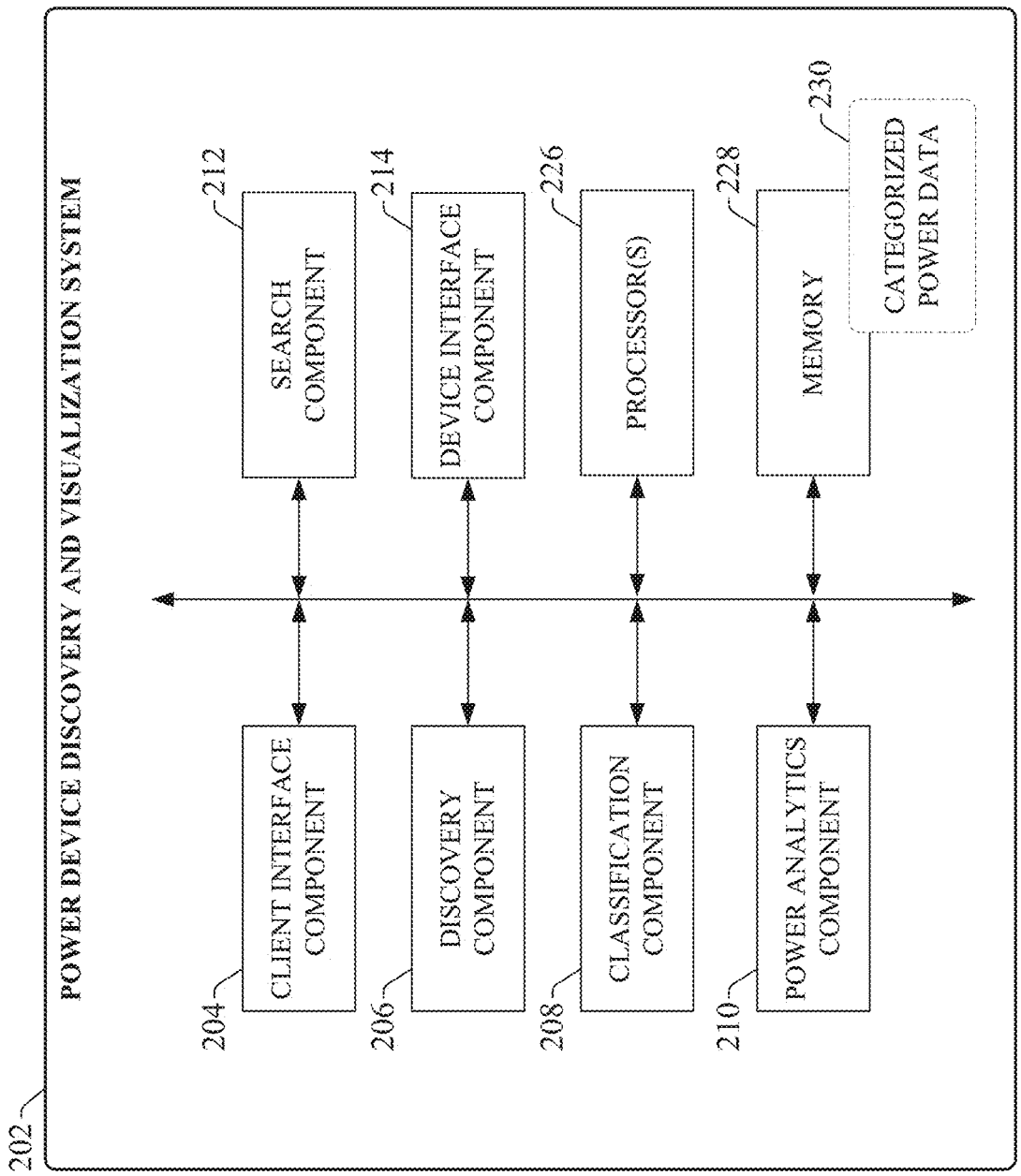
FIG. 2 is a block diagram of an example power device discovery and visualization system.

FIG. 2 is a block diagram of an example power device discovery and visualization system 202 according to one or more embodiments of this disclosure. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

Power device discovery and visualization system 202 can include a client interface component 204, a discovery component 206, a classification component 208, a power analytics component 210, a search component 212, a device interface component 214, one or more processors 226, and memory 228. In various embodiments, one or more of the client interface component 204, discovery component 206, classification component 208, power analytics component 210, search component 212, device interface component 214, the one or more processors 226, and memory 228 can be electrically and/or communicatively coupled to one another to perform one or more of the functions of the power device discovery and visualization system 202. In some embodiments, components 204, 206, 208, 210, 212, and 214 can comprise software instructions stored on memory 228 and executed by processor(s) 226. Power device discovery and visualization system 202 may also interact with other hardware and/or software components not depicted in FIG. 2. For example, processor(s) 226 may interact with one or more external user interface devices, such as a keyboard, a mouse, a display monitor, a touchscreen, or other such interface devices.

Client interface component 204 can be configured to exchange data with a client device interfaced with the system 202, such as a desktop, laptop, or tablet computer; a mobile device such as a smart phone; or other such client device. Client interface component 204 can generate graphical interface displays and render the displays on the client device. These interface displays can render power and energy data presentations, as well as receive user input for customizing the presentations. Client interface component 204 can also receive, via user interaction with the graphical interface displays, smart device configuration data to be downloaded or distributed to selected smart power and energy devices.

Discovery component 206 can be configured to discover and identify smart power and energy devices on a given plant network or set of specified plant networks, and to retrieve device information, available data tag information, and values of the available data tags stored on the discovered devices. In some embodiments, discovery component 206 can also be configured to discover interdependencies between two or more of the discovered devices (e.g., using pulse tracing or by other means). Classification component 208 can be configured to assign a classification or categorization to each discovered smart device, and store a device profile for the device according to the assigned classification. The collection of stored device profiles and their associated data tag values yields categorized power data 230, which is stored on memory 228. Example smart device classifications can include, but are not limited to, power meters, IEDs, VFDs, controllers (e.g., controllers with integrated power metering capabilities), motor control centers or their associated motor control devices, or other such classifications of smart power and energy devices. Categorized power data 230 comprises the identities of the smart power devices, information about the smart devices, their classifications, and their associated data items.

Power analytics component 210 can be configured to perform analytics on the categorized power data 230 obtained and indexed by the discovery component 206 and classification component 208. Search component 212 can be configured to submit search queries to the categorized power data 230 and retrieve search results representing selected subsets of available power device information specified by the search query. Device interface component 214 can be configured to communicatively connect to and exchange data with selected smart power and energy devices. This data exchange can include, for example, retrieval of historical or substantially real-time data tag values or downloading of user-defined configuration settings to the selected devices.

The one or more processors 226 can perform one or more of the functions described herein with reference to the systems and/or methods disclosed. Memory 228 can be a computer-readable storage medium storing computer-executable instructions and/or information for performing the functions described herein with reference to the systems and/or methods disclosed.

Figure 3:
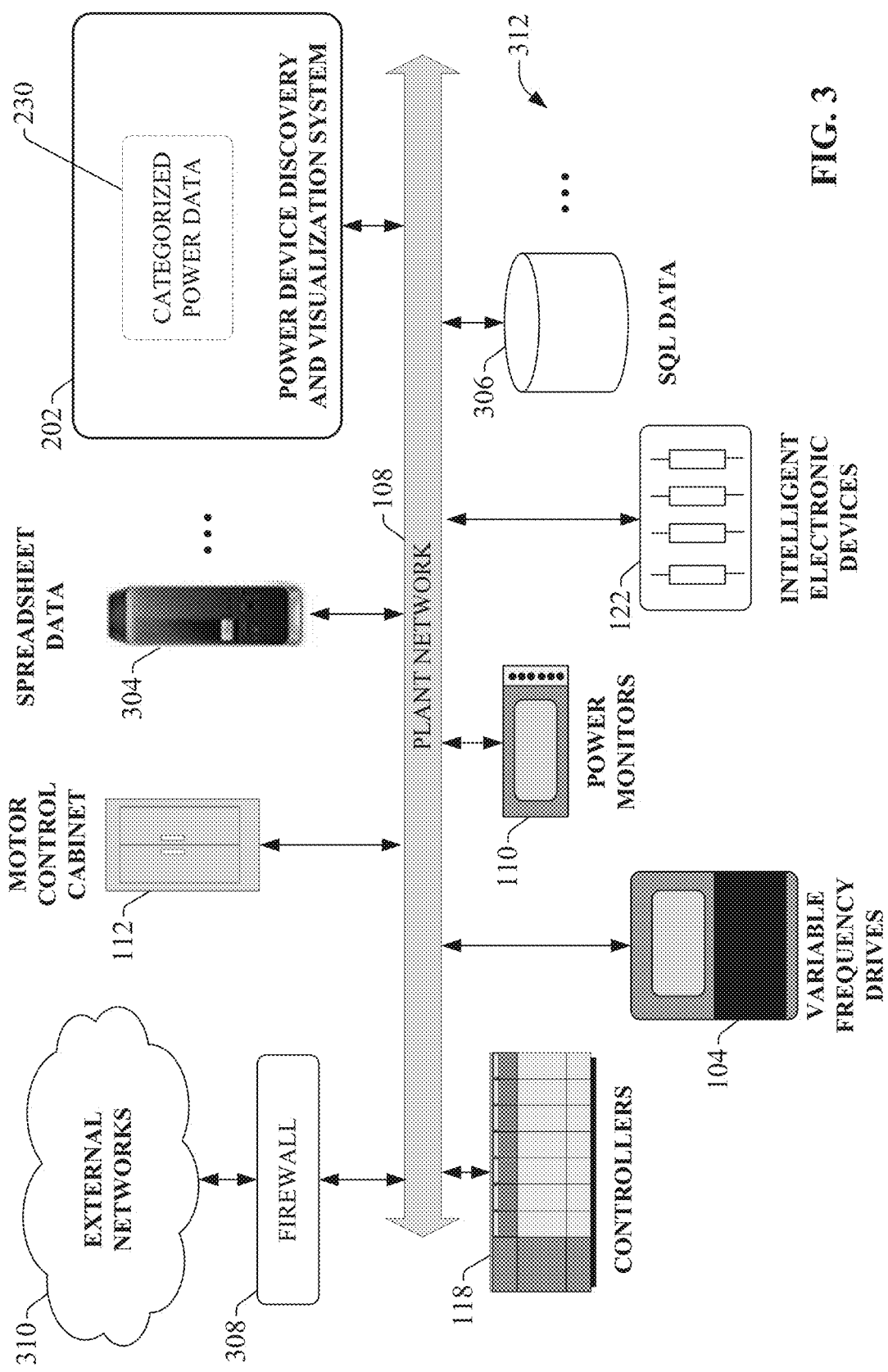
FIG. 3 is a block diagram of a generalized example architecture including a power device discovery and visualization system that discovers and categorizes smart power and energy devices throughout an industrial environment.

FIG. 3 is a block diagram of a generalized example architecture including a power device discovery and visualization system 202 that discovers and categorizes smart power and energy devices throughout an industrial environment. The example industrial environment depicted in FIG. 3 includes, in addition to machines and associated control systems used to carry out industrial processes (not shown in FIG. 3), a number of smart power and energy devices. These smart devices 312 can include, for example, power monitors 110, intelligent electronic devices 122 of various types (e.g., overload relays, circuit breakers, etc.), variable frequency drives 104 that monitor and record statistics relating to regulated power delivered to their respective motors, motor control centers 112 and their associated motor control devices, or other such devices. Industrial controllers 118 having integrated power monitoring features can also serve as sources of power and energy data. These may include industrial controllers 118 with modular power monitors installed on the controller's backplane, or controllers 118 having processor modules with integrated power monitoring capabilities. Power device discovery and visualization system 202 can also discover and categorize power and energy data stored in databases or other types of data storage, including but not limited to archived energy data recorded in spreadsheet files on a data storage device 304 or in an SQL database 306.

These diverse sources of power and energy data reside on a plant network 108. In some scenarios, smart power and energy devices may be distributed across multiple networks within the plant facility; e.g., a plant network and an office network communicatively connected through a firewall device or other network infrastructure device. Network 108 may also have access (e.g., via firewall 308) to external networks 310 such as the Internet or plant networks at other facilities within the industrial enterprise.

Power device discovery and visualization system 202, which also resides on network 108 in the illustrated example architecture, can discover, categorize, and index smart power and energy devices on the network 108 as well as the data items or data tags stored on each smart device. For each discovered smart power and energy device, the system 202 creates device profile data comprising an identity of the smart device, a categorization or classification of the smart device, and identities of data items or data tags available on the smart device (including both read-only measurement and diagnostic data as well as configuration parameters having both read and write permissives). System 202 can also retrieve historical, live, and/or configuration data from the available data tags on the smart devices, normalize this power and energy data to a common searchable format, and aggregate the data with the smart device profile data to yield categorized power data 230.

Figure 4:
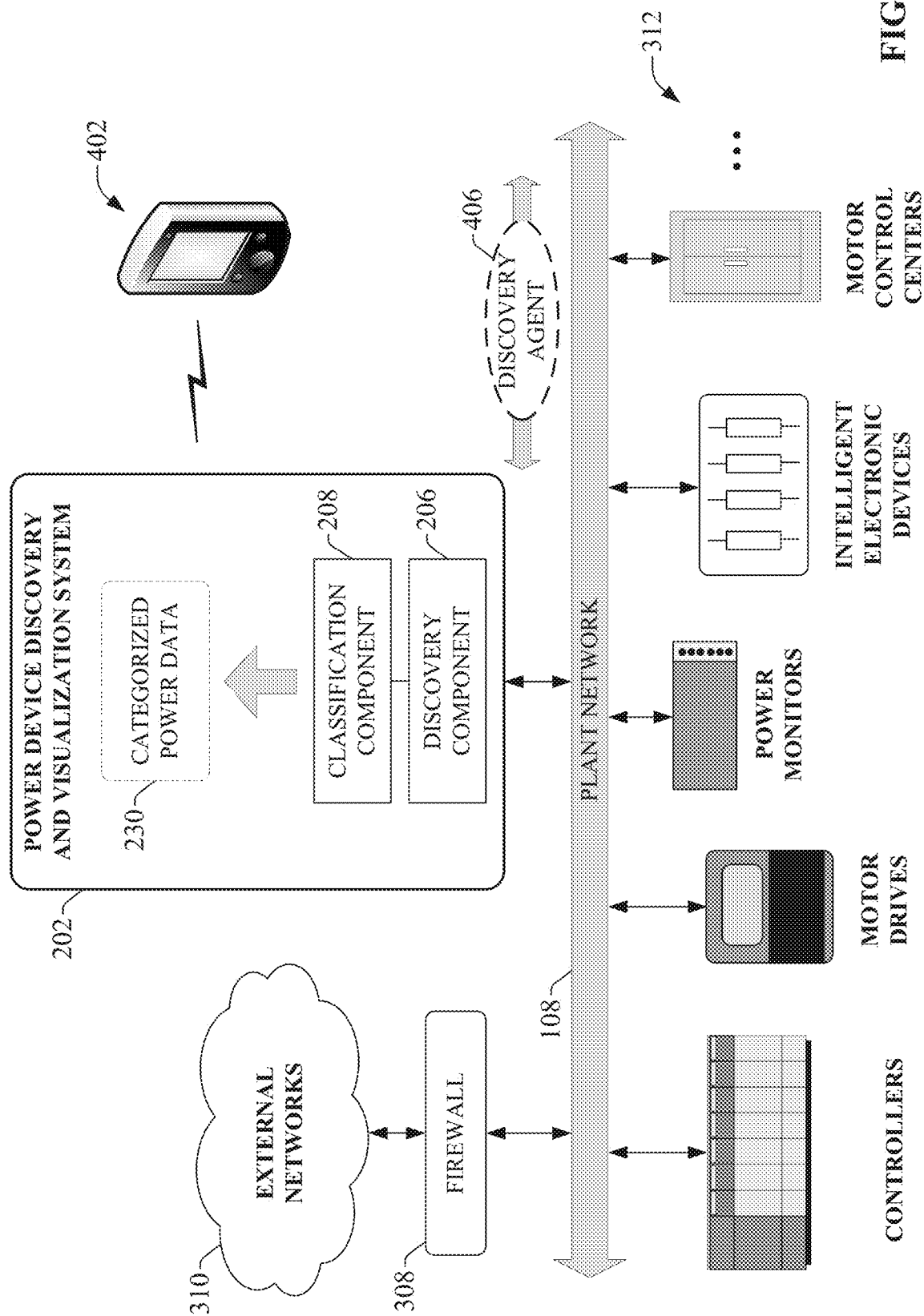
FIG. 4 is a diagram illustrating discovery of smart devices on a plant network using a discovery agent.

The system's discovery component 206 can employ any suitable technique for discovering smart power and energy devices 312 and their associated data tags. For example, some embodiments of system 202 can deploy a discovery agent to facilitate discovery and indexing of smart power and energy devices. FIG. 4 is a diagram illustrating discovery of smart devices 312 on a plant network 108 using a discovery agent 406. The discovery agent 406 may comprise, for example, a software script that crawls the network 108 to discover smart power and energy devices or other sources of power and energy data. This can include data sources that are internal to the plant as well as external data sources located outside the plant (e.g., at other related plant facilities) and accessible via external networks 310. The discovery agent 406 can report the discovered smart devices 312 and their associated data items to the system 202, which normalizes this information to a common searchable format, categorizes each discovered smart device 312, and indexes this smart device information as categorized power data 230. Although the present example leverages a discovery agent 406 to facilitate discovery of smart power and energy devices and other sources of energy data, some embodiments of system 202 may employ other techniques to discover and identify smart devices 312 on network 108. For example, in some embodiments the discovery component 206 may ping each device within the specified search range for that device's identity information, and create a device profile for each device that whose identity information indicates that the device is a smart power device or smart energy device.

In some scenarios, smart power and energy devices 404 may comprise a diverse heterogeneous collection of devices provided by different device vendors. As such, the information available on the various smart devices may vary—even for devices of the same device classification—depending on the device vendor. In general, discovery component 206 and/or classification component 208 will generate the device profile for a given device based on the vendor-specific set of information available on the smart device. Discovery component 206 and classification component 208 will also normalize the data collected from the diverse set of devices 404 according to a common format and data schema to facilitate collective searching and analysis of the resulting categorized power data 230.

Figure 5A:
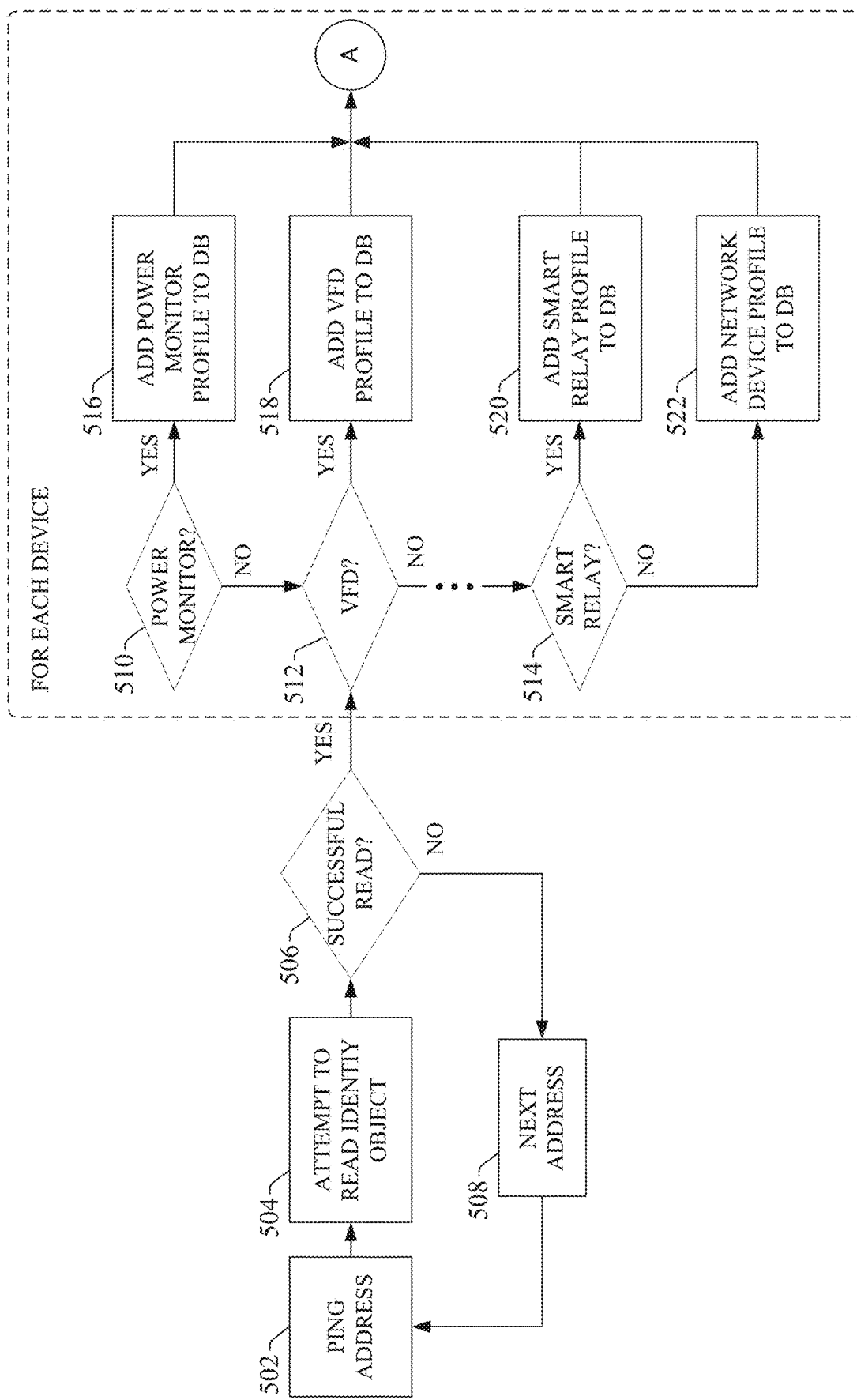
FIG. 5A is a flowchart illustrating a first part of an example discovery and indexing routine.

FIG. 5a is a flowchart illustrating a first part of an example discovery and indexing routine that can be implemented by system 202. Some embodiments of system 202 can allow the user to enter a range of network addresses within which to search for smart power and energy devices 404 before initiating the discovery sequence. Alternatively, the system 202 may automatically discover the range of network addresses that reside on the plant network and examine each of these devices for the presence of a smart power device or smart energy device. When the discovery sequence is initiated, discovery component 206 can, for each network address within the range, ping the address (step 502) and attempt to identify a smart power or energy device having that address (step 504). Some smart power and energy devices may be configured with an identity object that can be read by the discovery component 206 and which comprises identity information for the device. The identity information read from the smart device can include, for example, a name assigned to the device, vendor and model information for the device, or other such information.

If an attempt to read an identity object (or another form of device identification information) is not successful (NO at step 506), the next address in the range is selected (step 508), and the discovery component 206 attempts to read device identity information for that address. If the attempt to read the identity object is successful (YES at step 506), the discovery component 206 then determines the type of the device based on the identity information read from the device.

In some embodiments, classification component 208 can be configured to check each discovered device to determine whether the device corresponds to one of a set of defined smart power and energy device types. For example, if the classification component 208 determines, based on identification contained in the identity object, that the device is a power monitor (YES at step 510), the classification component 208 creates a power monitor device profile for the device based on information contained in the device's identity object and the available data items stored on the device, and adds this power monitor profile to the categorized power data 230. Similarly, if the classification component 208 determines that the device is a VFD (YES at step 512) or a smart relay (YES at step 514), a VFD device profile or a smart relay profile is created for the device and added to the categorized power data. Although FIG. 5a only depicts three defined device types (power monitors, VFDs, and smart relays), it is to be appreciated that other smart device types can be included in this classification step (e.g., controllers with power monitoring capabilities, motor control center power devices, other types of IEDs, etc.)

Classification component 208 checks the device's identity object against each defined smart power and energy device type until a correspondence is discovered between the identity object and one of the device type definitions, or until a determination is made that the device does not correspond to any of the defined smart device types. In some embodiments, if the device does not correspond to any of the defined smart power and energy device types (NO at step 514), the system 202 will nevertheless add a network device profile to the categorized power data 230 based on the device's identity object. Alternatively, in some embodiments, system 202 will only add profiles for discovered devices that correspond to one of the defined categories. Accordingly, if the classification component 208 determines that the device does not correspond to any of the defined smart device categories, the system 202 pings the next address in the defined network address range without adding a profile for the device.

If the device is found to correspond to one of the smart device categories but the categorized power data 230 already includes a profile for the device, classification component 208 will update the profile, if necessary, based on the newly obtained identity and/or data tag information for the device.

Figure 5B:
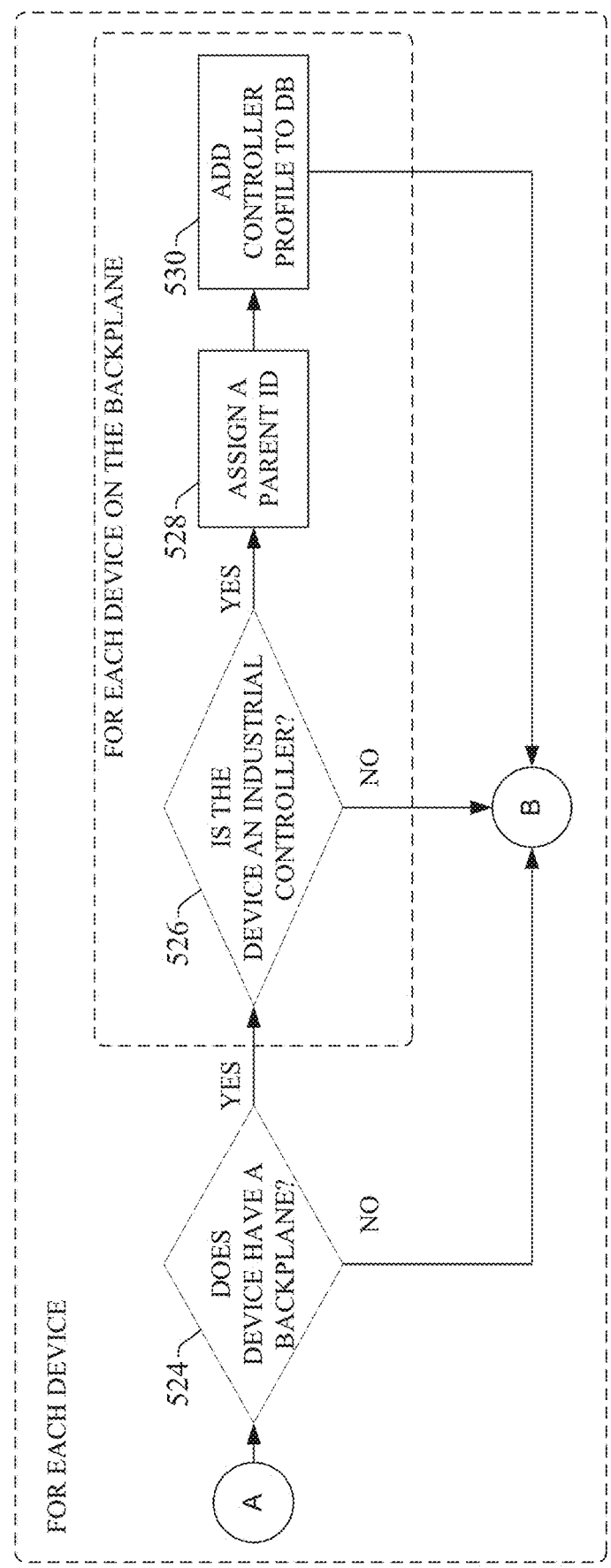
FIG. 5B is a flowchart illustrating a second part of the example discovery and indexing routine.

The discovery and classification procedure continues with the second part of the flowchart illustrated in FIG. 5B. The classification component 208 determines at step 524 whether the device has a backplane on which other modular devices are attached. If the device has a backplane (YES at step 524)

on which one or more modular devices are attached, the classification component 208 checks each modular device on the backplane to determine whether the modular device is an industrial controller. For each modular device that is an industrial controller (YES at step 526), the classification component 208 assigns a parent identifier to the controller that associates the controller with the parent device (step 528) and adds a device profile for the controller—including the parent identifier—to the categorized power data (step 530).

Figure 5C:
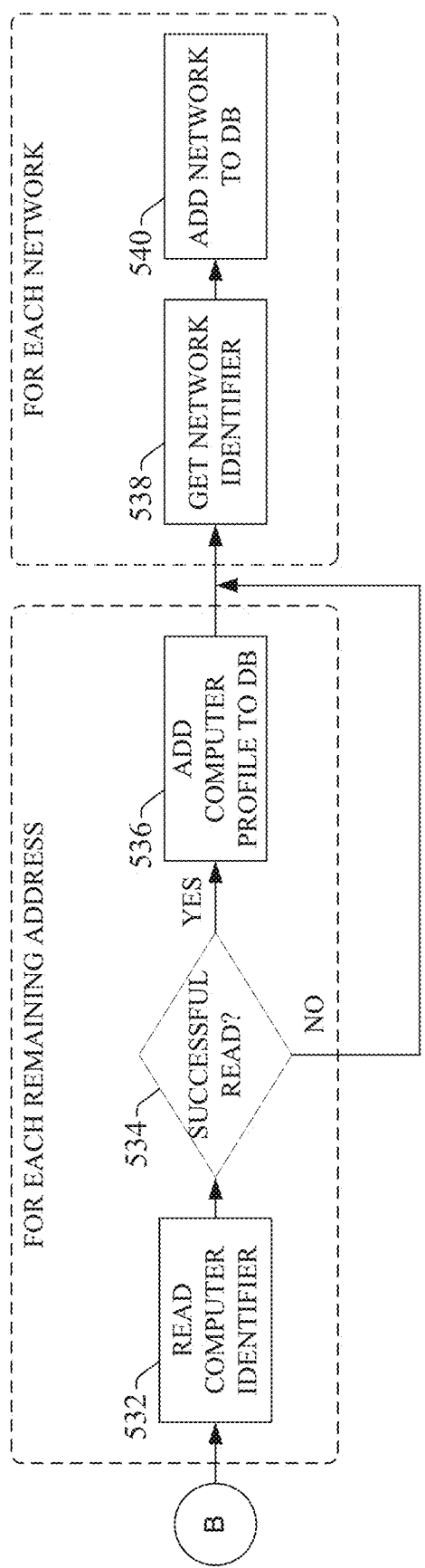
FIG. 5C is a flowchart illustrating a third part of the example discovery and indexing routine.

The methodology proceeds with the third part illustrated in FIG. 5C. For each remaining address that has not been classified—e.g., devices for which identity objects could not be found or read at step 506, or which otherwise could not be classified—classification component 208 attempts to read a computer identifier from the unclassified device (step 532). If the read is successful (YES at step 534), a generic computer profile for the unclassified device is added to the categorized power data 230 (step 536). If the read attempt is not successful (NO at step 534), no profile is added for the device.

Finally, for each network discovered by the system 202, a network identifier is obtained for the network (step 538) and a profile for the network is added to the categorized power data 230. The classification component 208 can also create an association between each discovered network and each device that was discovered on that network.

Figure 6:
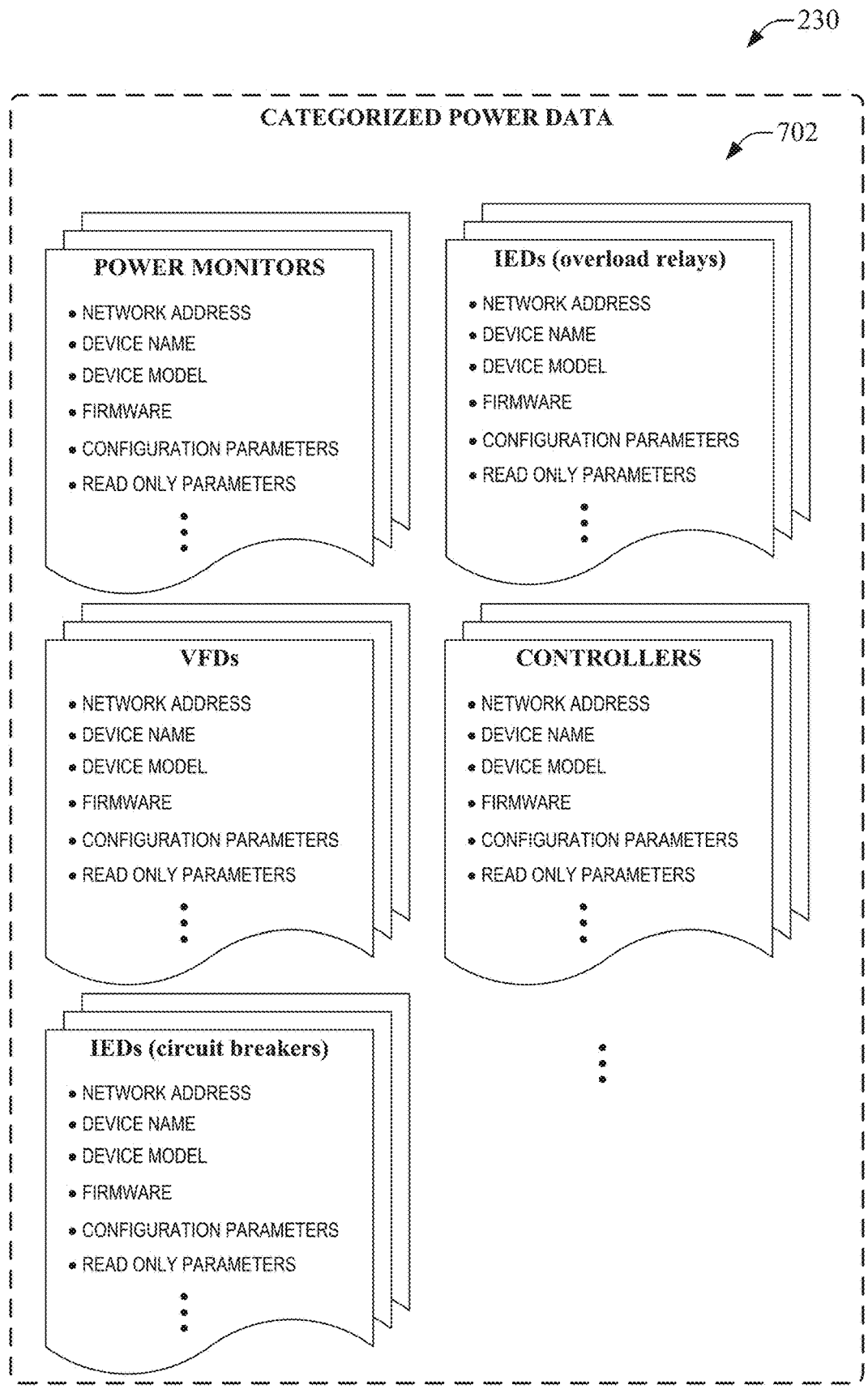
FIG. 6 is a diagram illustrating an example collection of smart power and energy device profiles that make up categorized power data.

FIG. 6 is a diagram illustrating an example collection of smart power and energy device profiles 602 that make up categorized power data 203. At the conclusion of the discovery sequence described above, categorized power data 230 will comprise sets of device profiles 602 corresponding to respective different types of smart devices (e.g., power monitors, IEDs, etc.). Each profile 602 comprises information about its corresponding smart devices (e.g., network address, device name, device model, current firmware version, etc.), as well as identities and values of data tags available for viewing and/or modification on the device. These data tags can include configuration parameters that can be modified by the user to facilitate configuration of the device as well as read-only parameters indicating power and/or energy measurements obtained by the device, status or diagnostic information for the device, or other such read-only parameters.

Figure 7:
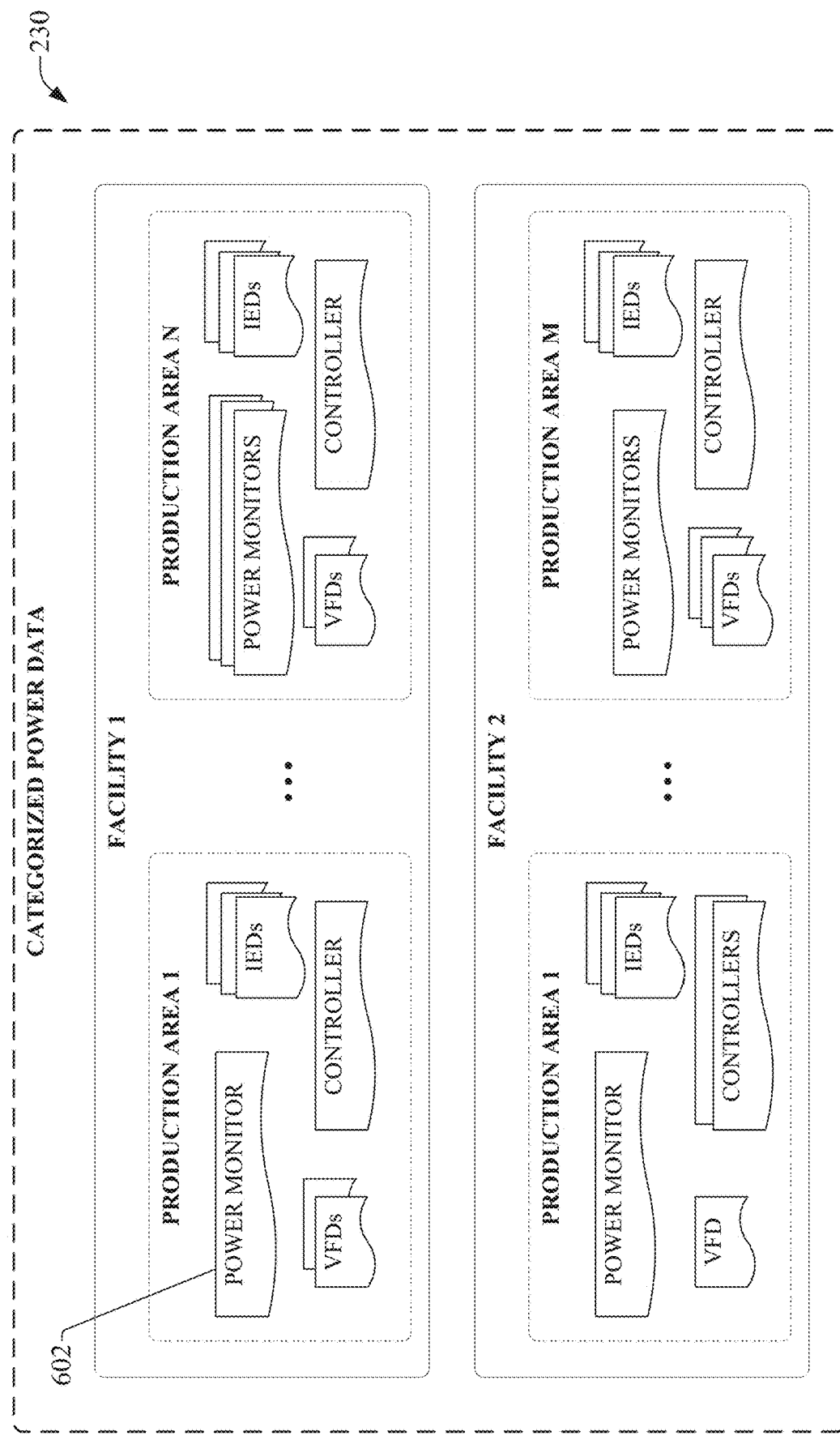
FIG. 7 is a diagram illustrating example groupings of smart device profiles according to the production facility and production area within which each profile is located.

In some embodiments, system 202 can also record locations of each discovered device within a given multi-tiered industrial enterprise. FIG. 7 is a diagram illustrating example groupings of smart device profiles 602 according to the production facility and production area within which each corresponding device is located. In the illustrated example, the industrial enterprise comprises two industrial facilities (Facility 1 and Facility 2), with each facility comprising a number of production areas. Categorized power data 230 assigns each device profile 602 to the facility and production area in which the device is located. In some scenarios, discovery component 206 can determine the facility and/or production area based on user-defined location information included in the identity object for the smart device. In other scenarios, the user may specify the location of a selected device via interaction with an interface display generated by client interface component 204. Although FIG. 7 depicts only a two-tiered location hierarchy that locates the smart devices according to facility and production area, embodiments of system 202 can define locational hierarchies having any number of tiers or levels, with each smart device assigned to a level of the hierarchy. This locational hierarchy is used by system 202 to generate location-based presentations or reports of an industrial enterprise's power and energy statistics.

In some embodiments, discovery component 206 can also identify physical and/or functional relationships between discovered smart devices as part of the network scanning sequence, and update categorized power data 230 to reflect the discovered relationships. For example, in addition to interfacing with plant network 108, some embodiments of power device discovery and visualization system 202 can be configured to interface with the power distribution system itself and perform pulse tracing analysis to discover or infer relationships between some or all of the discovered smart devices. According to this approach, discovery component 206 can inject electrical pulses or other types of signal patterns onto the power distribution system and identify relationships between devices based on subsequent measurements of the pulses. For example, discovery component 206 may measure an elapsed time between injection of a pulse onto the power distribution network and receipt of the pulse at one or more smart devices on the network. The relative times at which each device detects the pulse may be indicative of a distance between the devices. Accordingly, system 202 can translate these times into distances between pairs of devices, and record this information as part of categorized power data. Some such embodiments may also measure an amplitude of the pulse as measured by the respective devices, which may be indicative of the presence of power transformers on the power distribution network. For example, if a pulse having a known amplitude is measured as having the expected amplitude at a first device, but is measure as having a smaller amplitude at a second device, this may be indicative of the presence of a transformer between the first and second device. Accordingly, system 202 can insert a record of the transformer between the two devices in categorized power data 230.

Figure 8:
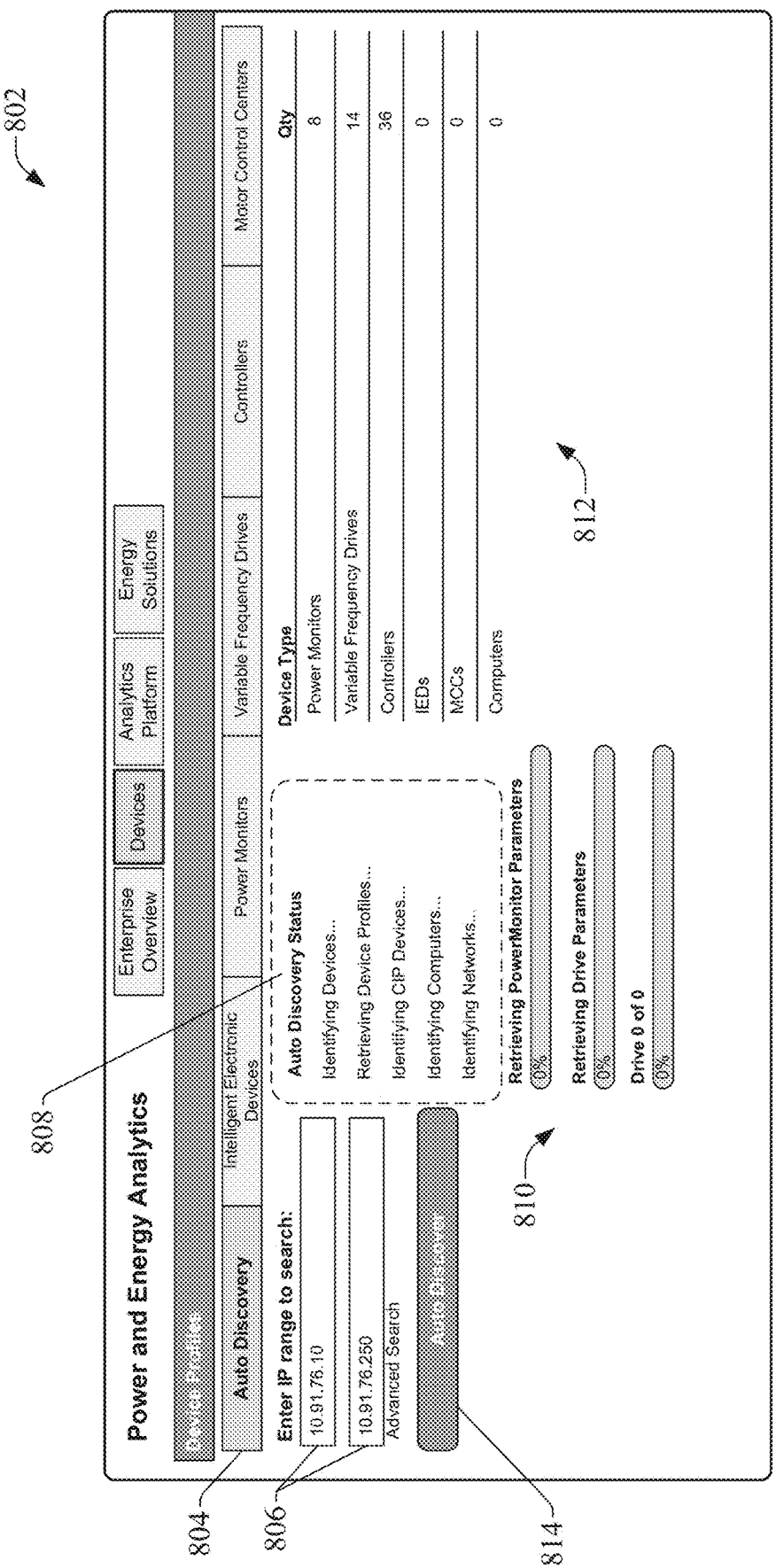
FIG. 8 is an example auto-discovery interface display that can be generated by a client interface component and rendered on client devices.

FIG. 8 is an example auto-discovery interface display 802 that can be generated by client interface component 204 and rendered on client device 402. In this example, auto-discovery interface display 802 is accessible by selecting an Auto-Discovery navigation control 804. Interface display 802 includes network address fields 806 that the user to specify a range of network addresses to be searched for the presence of smart power and energy devices 312 (e.g., in terms of a start address and an end address). After the network address range has been entered, the device discovery and classification sequence described above can be initiated by selecting Auto-Discover button 814. An Auto-Discovery status window 808 renders status information for the device discovery and classification process. Parameter retrieval status bars 810 can indicate statuses of parameter uploads from discovered smart devices. A device summary area 812 can provide statistics regarding the number of each type of smart device (e.g., power monitors, VFDs, controllers, etc.) discovered by the system 202.

Figure 9:
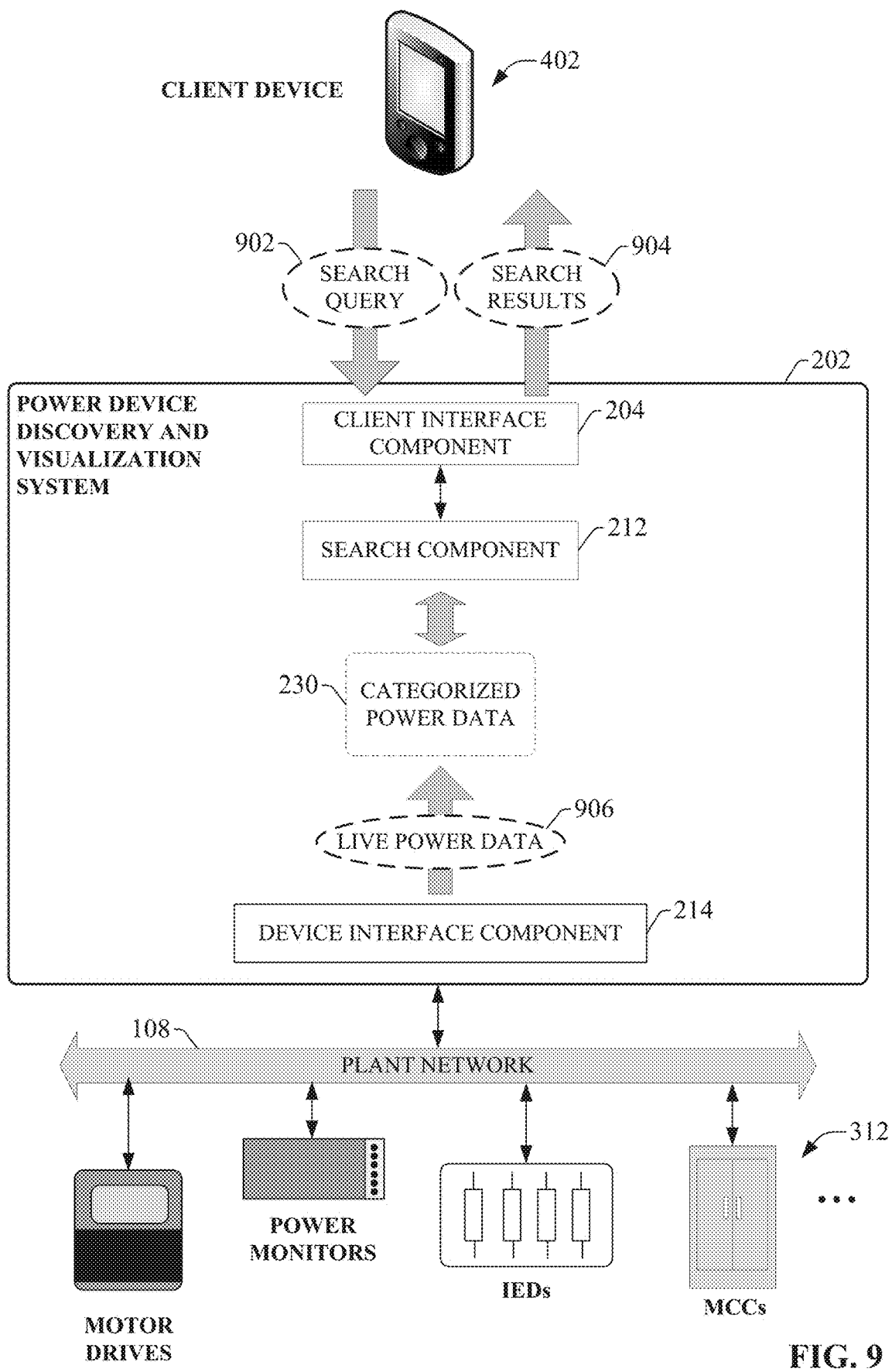
FIG. 9 is a diagram illustrating search and retrieval of desired power and energy data.

Using the discovery technique described above, power device discovery and visualization system automatically inventories and categorizes an industrial enterprise's smart power and energy devices by discovering the smart devices in use and their associated available data items. System 202 records the device profile information (power and energy device identifiers, information, and data tags), location information, and any functional relationships between the discovered devices as categorized power data 230, which can be remotely accessed and searched by a client device 402 to facilitate viewing of selected sets of historical, live, or configuration data obtained from the smart power and energy devices. FIG. 9 is a diagram illustrating search and retrieval of desired power and energy data based on the categorized power data 230 generated by the discovery component 206 and classification component 208. Client device 402 can be any mobile device (e.g., mobile phone, laptop computer, tablet computer, wearable computer, etc.) or fixed location computer (e.g., desktop computer, server, operator interface, etc.) capable of remotely or directly accessing system 202 via client interface component 204. In some embodiments, system 202 may be implemented on a web server, allowing client device 402 to access the categorized power data 230 via an Internet connection. System 420 may also be implemented on a networked local server accessible by the client device 402 via a wireless network connection. In yet another scenario, system 420 may be implemented on a cloud platform, where the system 202 executes as a cloud-based service.

With the industrial enterprise's smart power and energy devices inventoried and recorded as categorized power data 230, client interface component 204 can generate and render graphical interface displays on client device 402 that facilitate interaction with available power and energy data generated by and/or stored on the smart devices 312. For example, interface displays can be generated and rendered on client device 402 that allow a user to submit search query data 902 requesting a selected subset of available power and energy data. Search query data 902 may comprise, for example, a query for information regarding the identities and statuses of smart power and energy devices distributed throughout the enterprise, or deployed at specific locations (e.g., production areas, plant facilities, etc.) within the industrial enterprise. The search query data 902 may also comprise a request for a specified set of historical or real-time power and energy data available on a selected set of the smart devices. Search component 212 parses the submitted search query data 902 to determine the parameters of the search, and retrieves the requested subsets of the categorized power data 230 for presentation by the client interface component 204 as search result data 904. If the search query requires retrieval of real-time data tag values from one or more of the smart devices 312, device interface component 214 polls the appropriate smart devices via network 108 and retrieves the live power data 906 from the devices for rendering by the client interface component 204. Device interface component 214 can leverage information in the device profiles (e.g., network address, available data tag names, etc.) in order to communicatively connect to the relevant smart devices 312 over network 108 and obtain the requested data values from the devices 312.

Figure 10:
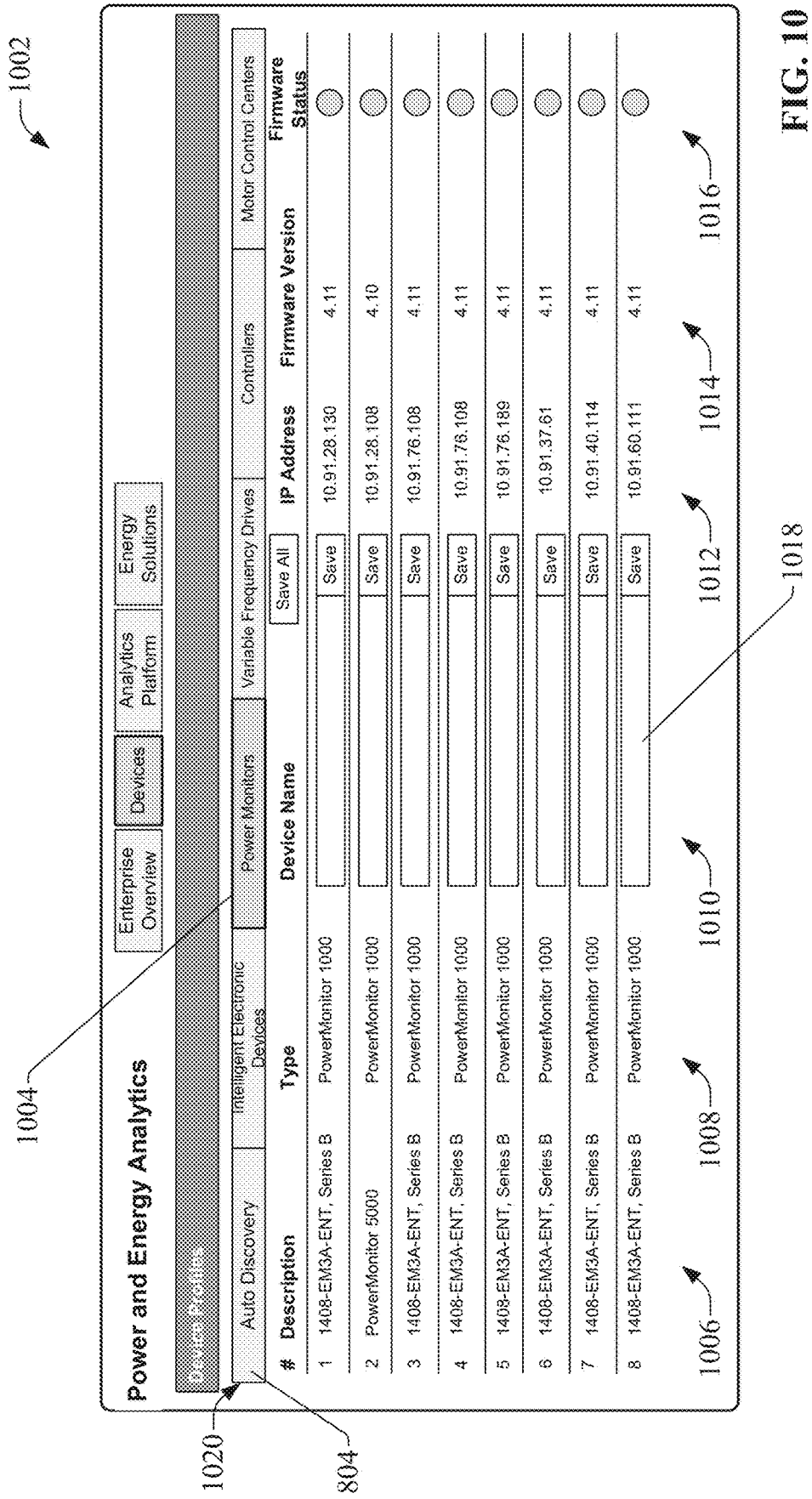
FIG. 10 is an example device profile interface display that lists power monitors that have been discovered by a power device discovery and visualization system.

Graphical interfaces generated by client interface component 204 can include a number of interactive controls that can be used to submit search queries to the system 202. FIG. 10 is an example device profile interface display 1002 that lists power monitors that have been discovered by power device discovery and visualization system 202. After system 202 has carried out the smart device discovery and classification sequence described above, the various types of smart power and energy devices 312 that have been discovered and recorded in categorized power data 230 are represented by device type selection buttons 1020. Selection of one of these buttons 1020 corresponding to a selected device type—e.g., Power Monitors button 1004—causes client interface component 204 to retrieve, from categorized power data 230, device profile data for the power monitors that were discovered within the industrial enterprise, and to render this device profile information on interface display 1002. Device profile information that can be rendered for each smart device corresponding to the selected device type can include, but is not limited to, a description 1006 of the smart device (e.g., a model and series number), a type 1008 of the smart device (where the type may be a particular product line of the device), a user-defined device name 1010 for the smart device, a network address 1012 of the smart device, a firmware version 1014 currently installed on the smart device, and a firmware status indicator 1016 indicating whether the smart device's firmware is up-to-date.

System 202 can allow the user to define names for each smart device via interface display 1002. Accordingly, each listed smart device is associated with a Device Name entry field 1018 that allows the user to enter a name for the device, which is then saved to categorized power data 230. In some embodiments, device interface component 214 may also write the user-defined device name to memory on the relevant device.

In some embodiments, the firmware status indicators 1016 can be color-coded to convey a recommended level of urgency in connection with firmware updates. For example, a green indicator 1016 can convey that the currently installed firmware is up-to-date (that is, the currently installed firmware corresponds to the most recently released version). A yellow indicator 1016 can indicate that the corresponding device is using an out-of-date version of the firmware, but that upgrading to the newest firmware is not critical. A red indicator 1016 can convey that the corresponding device is using an out-of-date version of the firmware that is known to cause performance issues, and that updating to the newest firmware is therefore critical.

The user can select any of the other device type selection buttons 1020 to switch the Device Profile view to a different device type. FIG. 11 is an example device profile interface display 1102 that is rendered when the variable frequency drives device selection button 1104 is selected. As shown in this figure, selecting another device type selection button changes the view to list device profile information for the subset of discovered smart devices corresponding to the selected device type. In some embodiments, system 202 may also allow users to select a production area of interested (e.g., from a list of production areas defined in categorized power data 230), causing client interface component 204 to filter the displayed list of devices and their associated data according to the selected production area. In such embodiments, search component 212 will select, as the data to be rendered, a subset of the device profile data categorized under the selected production area (as illustrated in FIG. 7). In some embodiments, system 202 can also allow the user to select a view of the device data whereby the smart devices are grouped according to production area of plant facility.

Sources for device profile information rendered on device profile interface displays can include the device profile data generated by the classification component 208 for each discovered smart device, as well as data tag values retrieved from data tags on the smart devices themselves.

Figure 12:
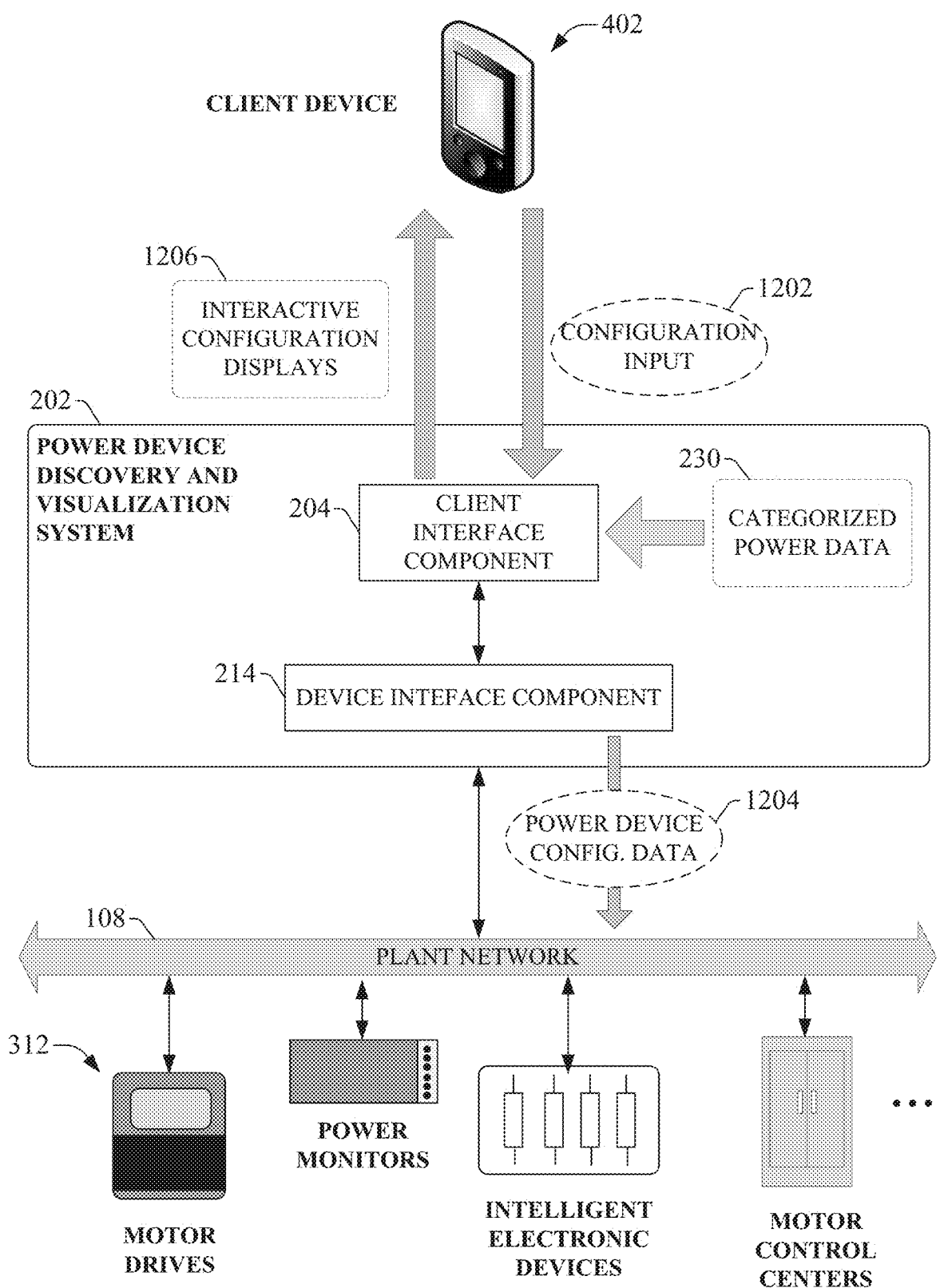
FIG. 12 is a diagram illustrating remote configuration of smart power and energy devices.

Power device discovery and visualization system can also allow users to configure selected smart power and energy devices remotely using a common configuration interface for all devices. FIG. 12 is a diagram illustrating remote configuration of smart power and energy devices using system 202. Client interface component 204 can render interactive configuration displays 1206 on client device 402 that allow the user to enter configuration data 1202 for selected smart devices recorded in categorized power data 230. For a given smart device, client interface component 204 can determine the configuration parameters that are available to be modified on that device based on the available configuration data tags for the device discovered by the discovery component and recorded in categorized power data 230.

Figure 13:
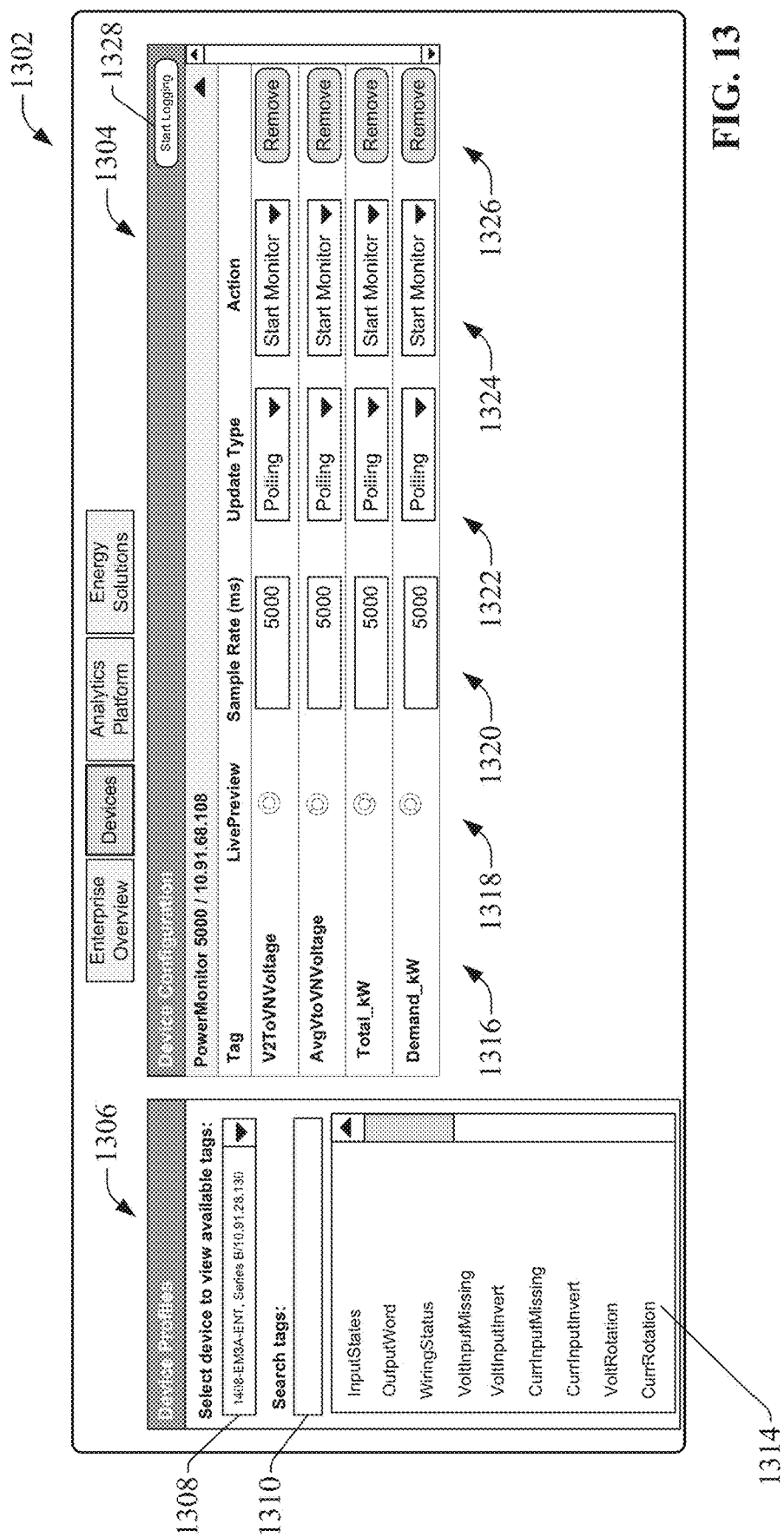
FIG. 13 is an example device configuration interface display that can be rendered by a client interface component.

FIG. 13 is an example device configuration interface display 1302 that can be rendered by client interface component. This example display 1302 includes a device profile search area 1306 that allows the user to select a device 312 to be configured using a device selection control 1308 (e.g., a drop-down device selection field or another type of selection control). Selection of a device using selection control 1308 causes a list of data tags available for viewing and/or modification to be displayed in list box 1314. These data tags can include, for example, tags containing live or historical electrical data measured by and stored on the device (e.g., voltages, currents, power statistics, energy consumed, energy generated, net energy consumption, peak demand, power factor, line-to-line voltages and currents, etc.), device status data (e.g., diagnostic or fault data, operating mode information, etc.), configuration parameters that can be changed by the user (e.g., scale factors, operating modes, engineering units, baud rates, etc.), or other such tags. The user can select one or more of the available data tags from the list box 1314 to be included in a monitoring and configuration area 1304 of the interface display 1302.

Selection of a data tag adds a list entry corresponding to the selected data tag to the monitoring and configuration area 1304. Each tag entry can include a name 1316 of the selected tag, an alphanumerical or graphical live preview 1318 of the data value contained in the tag, a sample rate 1320 for updating the tag value, an update type 1322 (e.g., polling, on change, etc.), a monitoring action 1324, and a remove button 1326 that allows the user to remove the selected tag from the monitoring list.

The live preview 1318 for a given data tag can comprise an alphanumeric rendering of the tag's value (that is, the value retrieved from the device by device interface component 214, as illustrated in FIG. 9). Alternatively, the live preview 1318 can be presented as a graphical object, such as a gauge, meter, bar graph, or another type of graphical object that provides an indication of the data tag's value. If the data tag corresponds to a read-only value, such as an electrical measurement or a device status, the live preview 1318 will be presented as a read-only value. Alternatively, if the data tag corresponds to a configuration parameter of the device, the live preview 1318 may replace the read-only value with a read-write data field that allows the user to modify the value as desired. Changing the value of a configuration parameter via interface display 1302 causes the device interface component 214 to write the modified value as power device configuration data 1204 to the appropriate tag on the device via network 108 (see FIG. 12).

For each data tag having a value that updates on a real-time basis, configuration interface display 1302 can include settings that control how the data tag value is updated on the display. For example, the sample rate 1320 can be modified as desired, allowing the user to set a frequency at which device interface component 214 polls for the data tag's value. Similarly, the monitoring type 1324 can be changed to allow the user to select whether the data tag value is to be polled periodically at the sampling rate specified by the sampling rate field, or alternatively if the data value will be updated each time the value changes. The controls for monitoring action 1324 allow the user to start or stop live monitoring of the data tag value.

In some embodiments, a Start Logging button 1328 can be provided that allows the user to instruct system 202 to log values of the selected data tags over time. In response to selection of button 1328, values of all data tags listed in the device monitoring and configuration area 1304 will be stored as time-series data according to a user-specified logging frequency.

Although FIG. 13 depicts a scenario in which data tags from a single smart power and energy device is displayed in the device monitoring and configuration area 1304, some embodiments of system 202 can allow the user to add data tags from multiple different smart devices to the presentation, allowing the user to create a customized aggregate view of live or historical power and energy statistics from different devices or production areas, or to configure multiple smart power and energy devices via a single graphical interface display.

Figure 14:
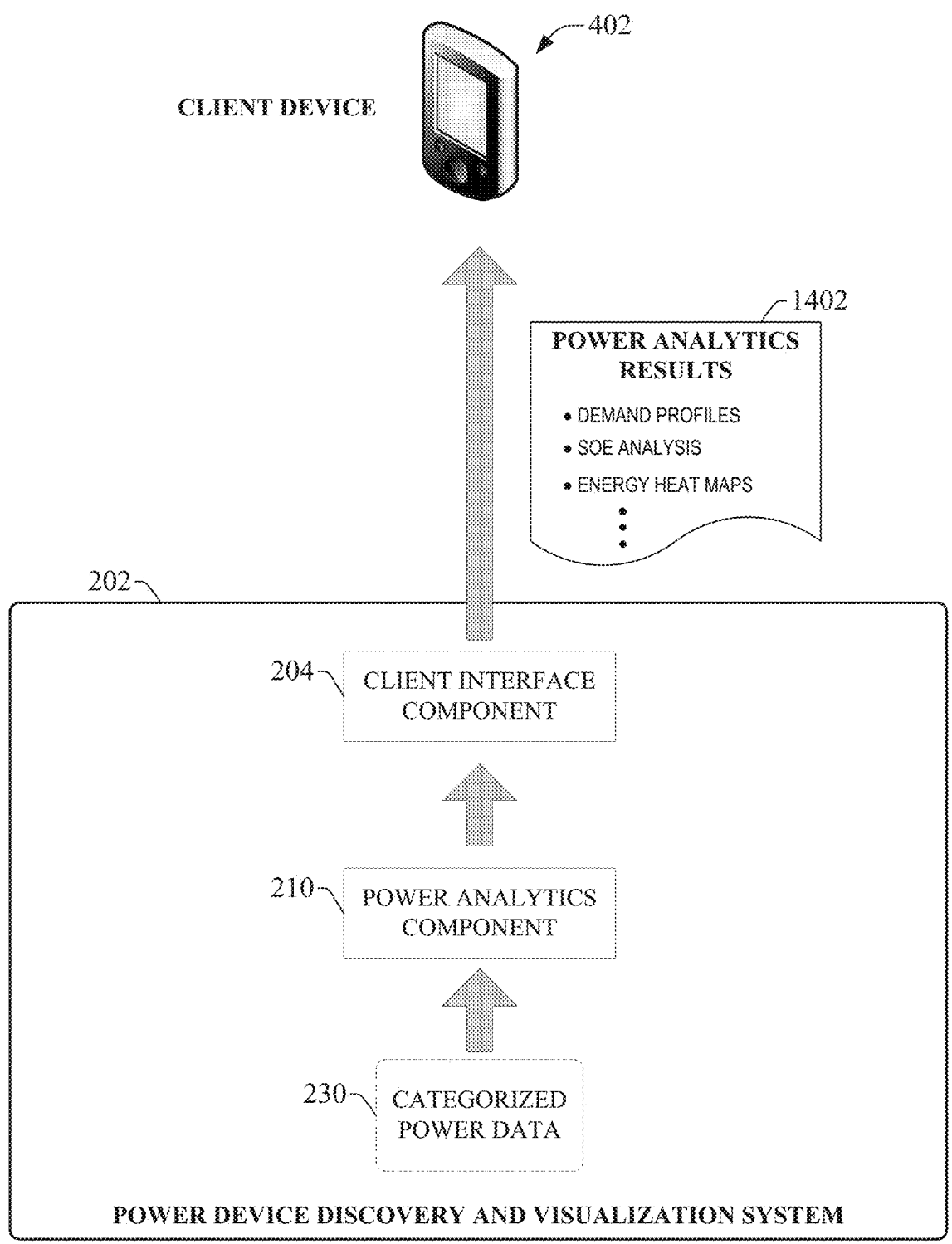
FIG. 14 is a diagram illustrating generation of power analytics results by a power device discovery and visualization system.

In addition to the monitoring and configuration aspects discussed above, some embodiments of power device discovery and visualization system 202 can also perform power analytics on selected subsets of the categorized power data 230. FIG. 14 is a diagram illustrating generation of power analytics results 1402 by system 202. Embodiments of system 202 can include a power analytics component 210 that can perform various types of analysis or selective data aggregation on the categorized power data 230.

Figure 15:
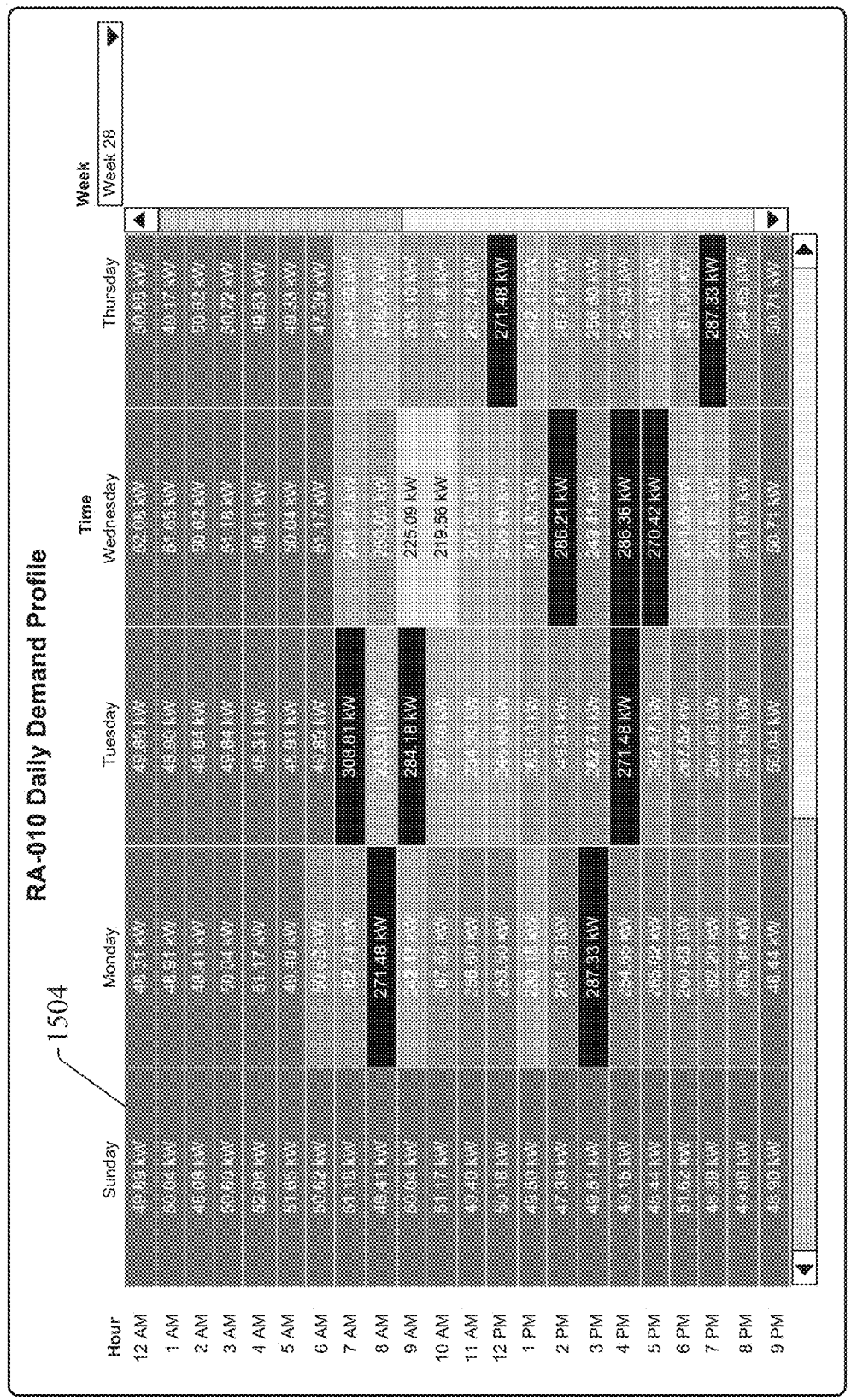
FIG. 15 is an example daily demand profile display that can be generated by a client interface component and populated with data values generated by a power analytics component.

In an example type of analytics, power analytics component 210 may aggregate selected sets of power data retrieved from the smart devices 312 to yield an hourly demand profile for a plant facility, for selected areas within the plant, or for multiple plant facilities within an industrial enterprise. FIG. 15 is an example daily demand profile display 1502 that can be generated by client interface component 204 and populated with data values generated by power analytics component 210. In this example, power analytics component 210 has been configured to determine, based on analysis of categorized power data 230, an hourly energy demand for a selected production area. Determining this hourly demand may involve, for example, aggregating the measured demands measured by multiple smart power meters or other smart power and energy devices within the specified production area. Client interface component 204 then generates demand profile display 1502 rendering the historical hourly aggregate demand for each day of the week in respective cells 1504 of a grid, where each column of the grid represents a day of the week and each row represents an hour of the day. In some embodiments, each cell 1504 can be color-coded to correspond to a range within which the corresponding demand value resides, providing a means to quickly find peak demand hours and low-demand hours. Some embodiments of client interface component 204 can also be configured to render energy demand in the form of energy heat maps or other suitable visualization formats.

Some embodiments of system 202 can render views of the daily demand profile for selected facilities or selected areas within a plant facility. For example, in response to selection of a specific production area of interest (e.g., from a list of available production areas defined in categorized power data 230, based on the data organization illustrated in FIG. 7), system 202 can render a view of the demand profile for that production area based on a subset of the categorized power data 230 corresponding to the selected area. Each item of demand data (e.g., the value in each cell 1504) may be an aggregation of power data from multiple power monitoring devices that collect power and energy usages for the area. System 202 can also render an aggregate demand for the entire facility or industrial enterprise, thereby affording a higher-level view of the enterprise's hourly and daily demand.

Some embodiments of power analytics component 210 can also be configured to perform sequence-of-events (SOE) analysis on the categorized power data 230. According to this type of analysis, power analytics component 210 analyzes selected subsets of the categorized power data 230 to identify a root cause of a fault in power distribution, such as a trip. In order to trace the root cause of the power distribution fault, power analytics component 210 may analyze historical device status information for selected smart devices—e.g., statuses of overload relay, circuit breakers, or other IEDs—as well as time-series voltage or current values measured by respective devices. Power analytics component 210 can identify correlations between these statuses and measurements in order to infer a probably root cause of the power distribution fault. Client interface component 204 can then render a graphical or alphanumerical indication of the root cause; e.g., by rendering a map of the plant facility that includes a graphical indication of the location of the root case, together with a message explaining the likely cause of the fault event. To facilitate accurate event correlation in connection with SOE analysis or other types of analytics carried out by power analytics component 210, device interface component 214 can be configured to synchronize live power data 906 retrieved from the power device's data tags according to a common time standard (e.g., a master clock maintained by the system 202 or an external system).

Some embodiments of power analytics component 210 can also perform preventative analytics on time-series power and energy data recorded in categorized power data 230. This can include, for example, identifying power distribution trends based on analysis of time-series voltage, current, power, and/or energy data recorded in the data 230. Trends that can be identified based on this time-series analysis can include, for example, hours of peak demand for respective days of the week, estimates of power utilization by a given production area while the production area is operating in a given operating mode (e.g., during production of a particular product or during a particular stage of a manufacturing process), or other such information. Results of this time-series analysis can be rendered by the client interface component 204.

Some embodiments of power device discovery and visualization system 202 can also be configured to normalize categorized power data 230 to a common data standard that allows the categorized power data 230 to be exchanged with external applications and systems. For example, system 202 may be configured to convert categorized power data 230 to Power Quality Data Interchange Format (PQDIF) or another shared power data format, allowing the categorized power data 230 (e.g., voltage, current, power, and energy measurements) to be read by external applications that support the shared format.

Figure 16:
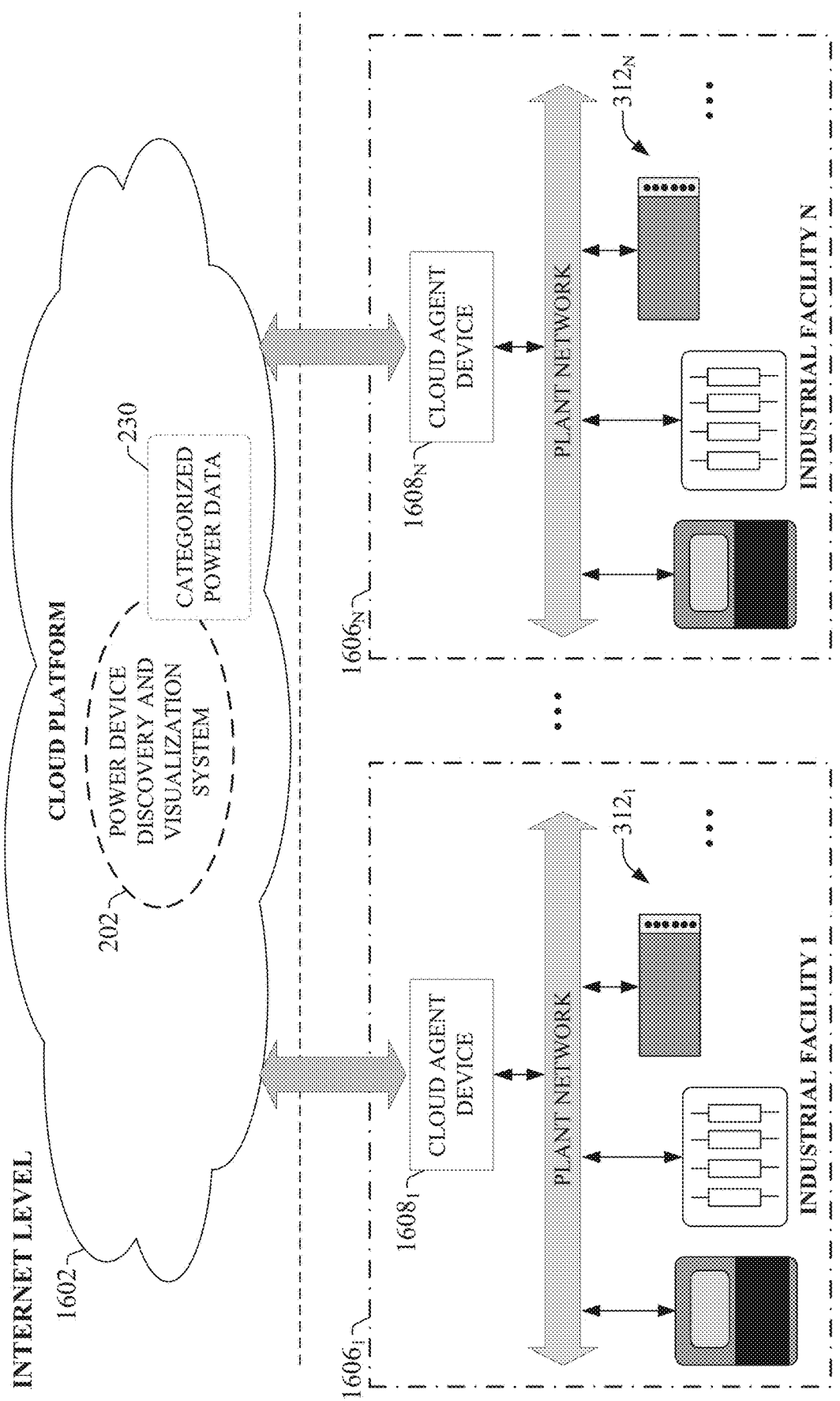
FIG. 16 is a conceptual diagram of a generalized cloud-based implementation for a power device and visualization system.

As noted above, one or more embodiments of the power device discovery and visualization system 202 can be implemented on a cloud platform. FIG. 16 is a conceptual diagram of a generalized cloud-based implementation for the system 202 described herein. In this implementation, the power device discovery and visualization system 202 executes as a cloud-based service on cloud platform 1602, allowing power and energy data from multiple geographically diverse industrial facilities (e.g., industrial facilities $1606_1$-$1606_N$) to be aggregated in the cloud platform 1602 for viewing. This cloud-based implementation also allows a user to access the system 202 and its associated categorized power data 230 from substantially any location.

Cloud platform 1602 can be any infrastructure that allows the system 202 to be accessed and utilized by cloud-capable devices. Cloud platform 1602 can be a public cloud accessible via the Internet by devices having Internet connectivity and appropriate authorizations to utilize the power device discovery and visualization system 202. In some scenarios, cloud platform 1602 can be provided by a cloud provider as a platform-as-a-service (PaaS), and the system 202 can reside and execute on the cloud platform 1602 as a cloud-based service. In some such configurations, access to the cloud platform 1602 and the system 202 can be provided to customers as a subscription service by an owner of the system 202. Alternatively, cloud platform 1602 can be a private or semi-private cloud operated internally by the enterprise, or a shared or corporate cloud environment. An example private cloud can comprise a set of servers hosting the system 202 and residing on a corporate network protected by a firewall.

If cloud platform 1602 is a web-based cloud, cloud agent devices 1608 at the respective industrial facilities 1606 may interact with power device discovery and visualization system 202 directly or via the Internet. In an example configuration, the smart power and energy devices 312 connect to the on-premise cloud agent devices 1608 through a physical or wireless local area network or radio link. In another example configuration, the smart devices 312 may access the cloud platform 1602 directly using integrated cloud agents.

Embodiments of the power device discovery and visualization system 202 described herein can significantly reduce the time and labor involved in configuring an industrial facility's smart power and energy devices by providing a single interface for discovering, cataloguing, viewing, and configuring these smart devices. The system 202 allows the user to discover and interact with configuration parameters and data tags of smart power and energy devices distributed across one or more plant facilities. Some embodiments of system 202 can also generate customized views of an industrial enterprise's power and energy utilization by aggregating selected sets of power and energy data from the plant's smart power and energy devices, and can perform diagnostic and performance analytics that yield insights into an industrial enterprise's power and energy utilization.

Figure 17:
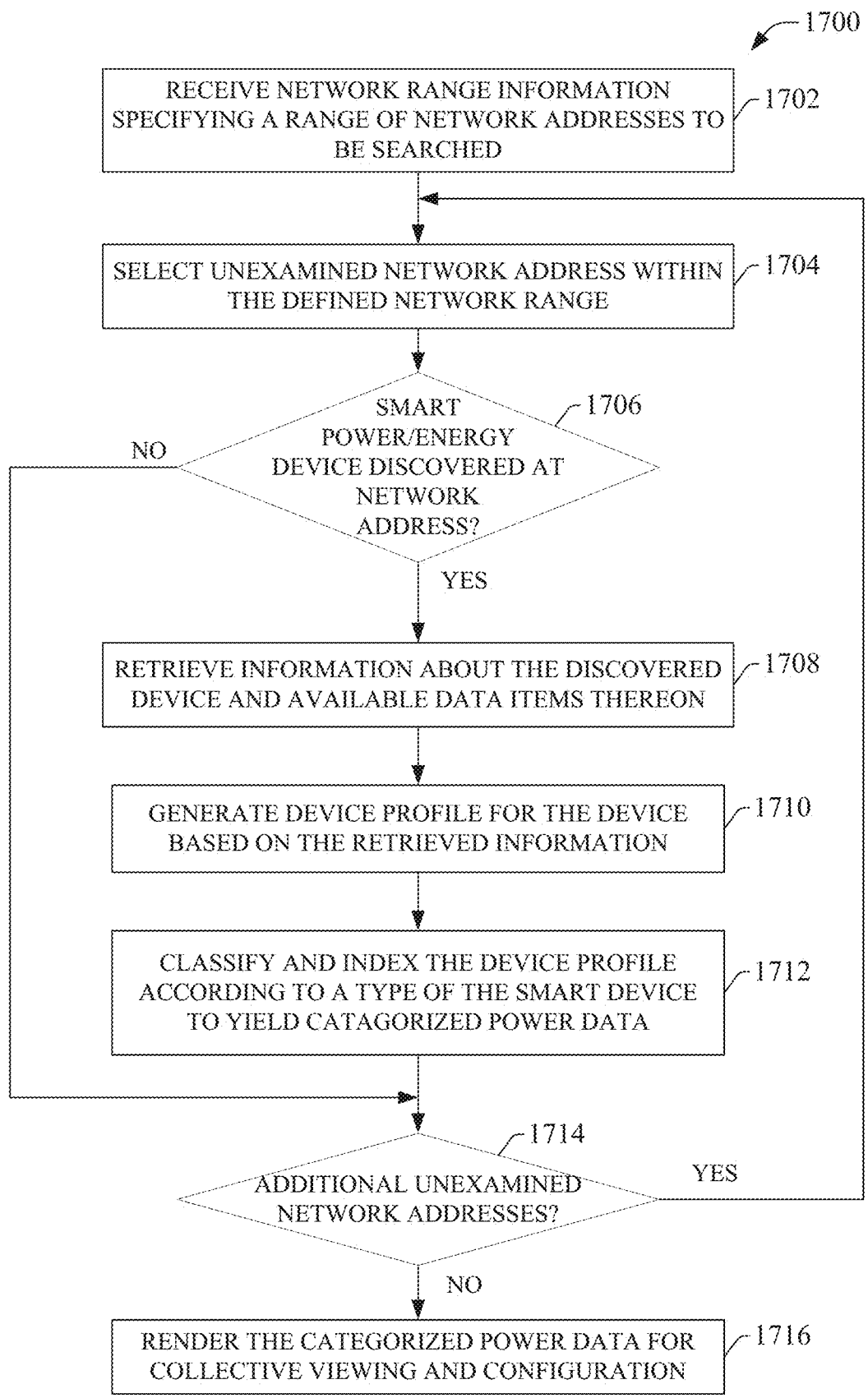
FIG. 17 is a flowchart of an example methodology for discovering and cataloging smart power and energy devices deployed within an industrial facility.
Figure 18:
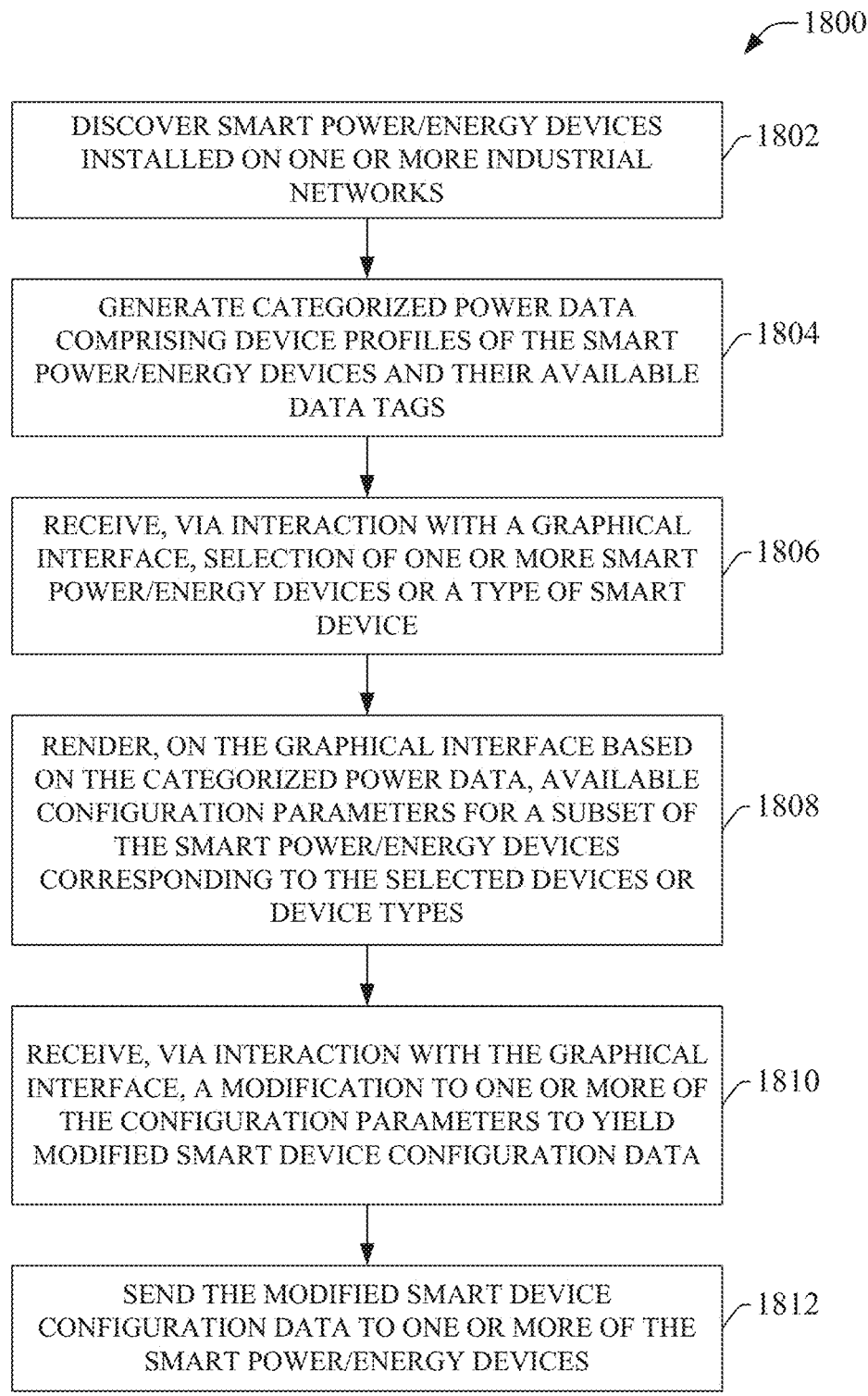
FIG. 18 is a flowchart of an example methodology for remotely configuring smart power and energy devices.

FIGS. 17-18 illustrate various methodologies in accordance with one or more embodiments of the subject application. While, for purposes of simplicity of explanation, the one or more methodologies shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 17 illustrates an example methodology 1700 for discovering and cataloging smart power and energy devices deployed within an industrial facility. Initially, at 1702, network range information specifying a range of network addresses to be searched is received. The network range information may be received, for example, via interaction with a graphical interface display that prompts a user to provide the desired network range. Alternatively, the network range may be automatically selected based on a determination of the range of network addresses in use on an industrial plant network being examined.

At 1704, an unexamined network address within the network range defined at step 1702 is selected. At 1706, a determination is made as to whether a smart power or smart energy device is discovered at the network address selected at step 1704. If a smart power or energy device is discovered (YES at step 1706), the methodology proceeds to step 1708, where information about the discovered devices and the available data items on the discovered smart device are retrieved from the device. The retrieved information can include, for example, a name and model of the smart device, a network address of the device, a type of the smart device (e.g., a power meter, an IED, etc.) a firmware version installed on the network device, data tags available on the device (e.g., measurement data tags, device diagnostic tags, etc.), configuration parameters of the smart device, or other such information. At 1710, a device profile for the device is generated based on the information retrieved at step 1708. At 1712, the device profile is classified and indexed according to device type (e.g., power meter, IED, controller with integrated power monitoring capabilities, VFD, etc.) to yield categorized power data. After classification and indexing of the device profile, or if no smart power device or smart energy device is discovered at the network address (NO at step 1706), the methodology proceeds to step 1714.

Steps 1706-1714 can also include a search for modular smart power devices and smart energy devices installed on controller backplanes, as discussed above in connection with FIGS. 5A-5C.

At 1714, a determination is made as to whether there are additional unexamined network addresses. If there are additional unexamined network addresses (YES at step 1714), the methodology returns to step 1704 where another unexamined network address is selected, and steps 1706-1712 repeat for the selected address. Steps 1704-1714 repeat until there are no remaining unexamined network addresses (NO at step 1714). When all network addresses within the specified range have been examined, the categorized power data for the discovered devices is rendered at step 1716 for collective viewing, or to facilitate configuration of one or more of the smart device configuration parameters.

FIG. 18 illustrates an example methodology 1800 for remotely configuring smart power and energy devices. Initially, at 1802, smart power and energy devices installed on one or more industrial networks are discovered (e.g., using methodology 1700 or the discovery sequence discussed above in connection with FIGS. 5A-5C). At 1804, categorized power data is generated comprising device profiles of the smart power and energy devices and their available data tags (e.g., measured data tags, configuration parameter data tags, device diagnostic tags, etc.).

At 1806, selection of one or more smart power and energy devices or a type of smart power/energy device is received via interaction with a graphical interface. At 1808, available configuration parameters for a subset of the smart power and energy devices corresponding to the devices or device types selected at step 1806 are rendered on the graphical interface. At 1810, a modification to one or more of the configuration parameters rendered at step 1808 is received, the modification yielding modified smart device configuration data. At 1812, the modified smart device configuration data received at step 1810 is sent to the relevant smart power and energy devices to facilitate configurating those devices.

Embodiments, systems, and components described herein, as well as industrial control systems and industrial automation environments in which various aspects set forth in the subject specification can be carried out, can include computer or network components such as servers, clients, programmable logic controllers (PLCs), automation controllers, communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, instrumentation, and human machine interface (HMI) that communicate via the network, which includes control, automation, and/or public networks. The PLC or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as common industrial protocol (CIP) networks including DeviceNet, ControlNet, and Ethernet/IP. Other networks include Ethernet, DH/DH+, Remote I/O, Fieldbus, Modbus, Profibus, CAN, wireless networks, serial protocols, near field communication (NFC), Bluetooth, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 19:
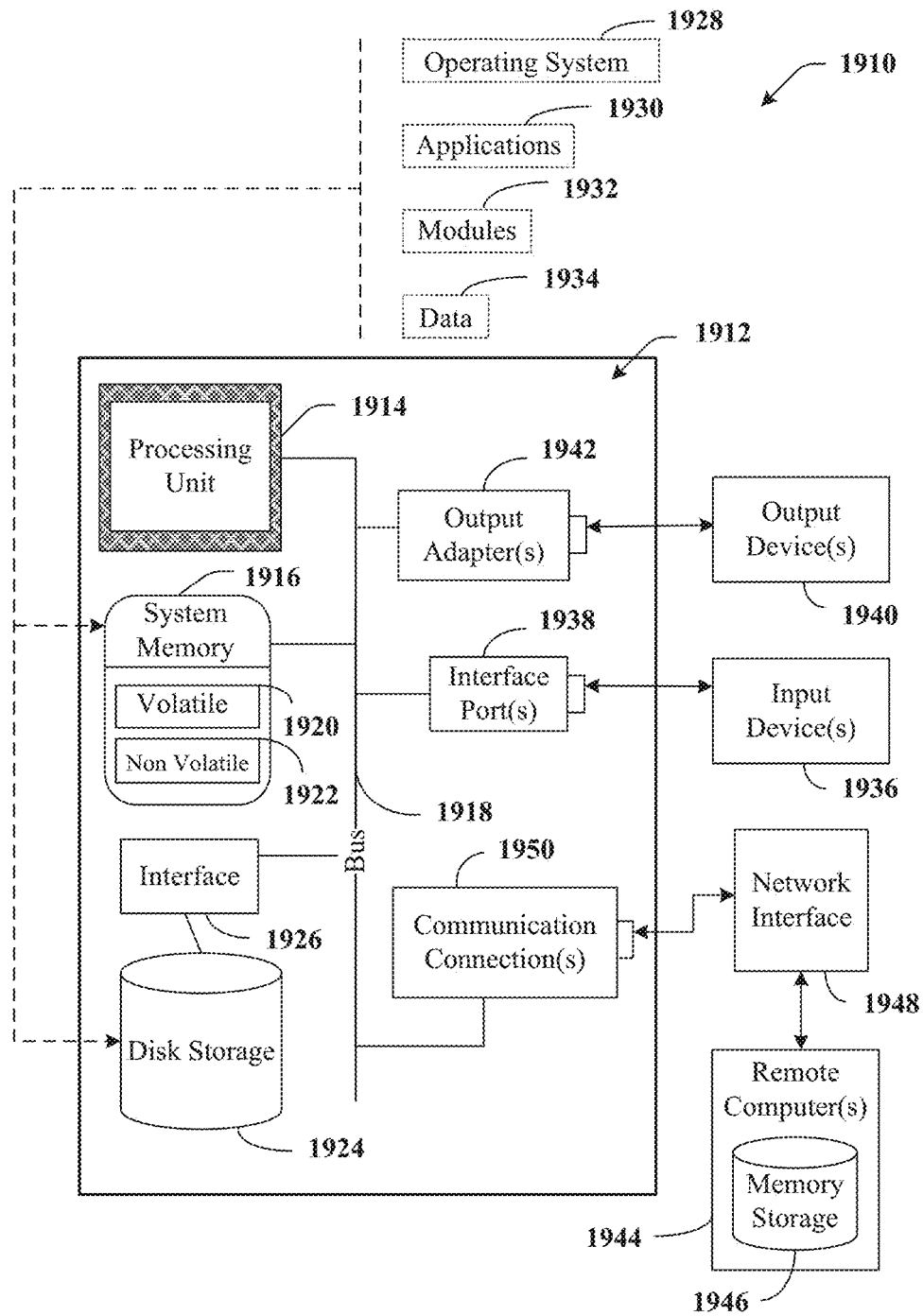
FIG. 19 is an example computing environment.
Figure 20:
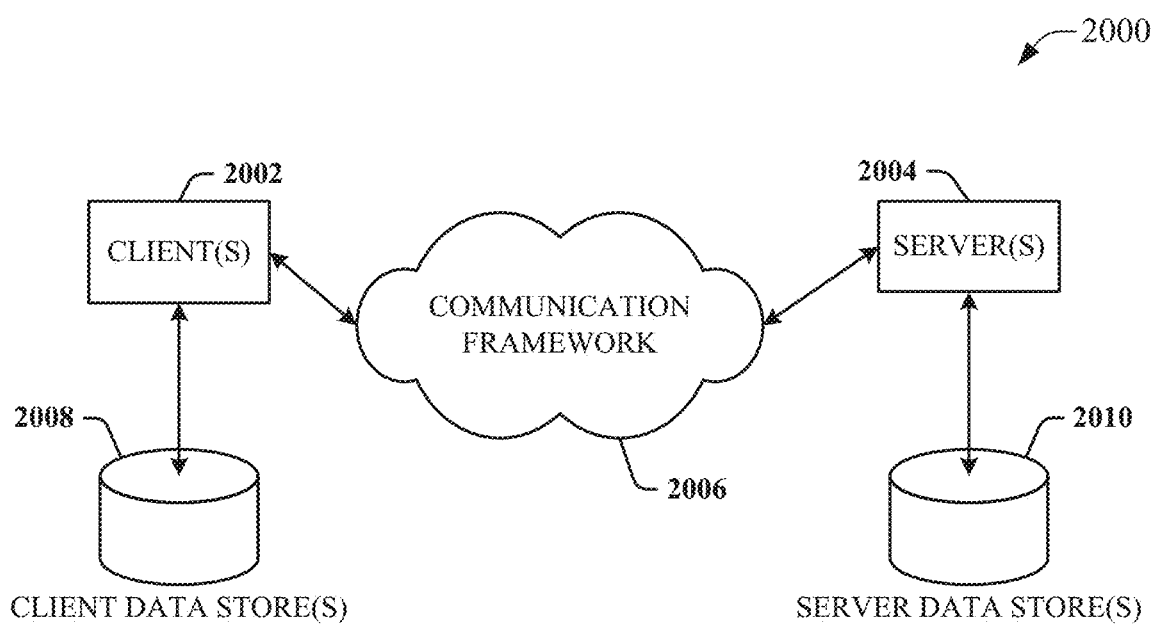
FIG. 20 is an example networking environment.

In order to provide a context for the various aspects of the disclosed subject matter, FIGS. 19 and 20 as well as the following discussion are intended to provide a brief, general description of a suitable environment in which the various aspects of the disclosed subject matter may be implemented.

With reference to FIG. 19, an example environment 1910 for implementing various aspects of the aforementioned subject matter includes a computer 1912. The computer 1912 includes a processing unit 1914, a system memory 1916, and a system bus 1918. The system bus 1918 couples system components including, but not limited to, the system memory 1916 to the processing unit 1914. The processing unit 1914 can be any of various available processors. Multi-core microprocessors and other multiprocessor architectures also can be employed as the processing unit 1914.

The system bus 1918 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1916 includes volatile memory 2320 and nonvolatile memory 1922. The basic input/output system (BIOS), containing the basic routines to transfer information between elements within the computer 1912, such as during start-up, is stored in nonvolatile memory 1922. By way of illustration, and not limitation, nonvolatile memory 1922 can include read only memory (ROM), programmable ROM (PROM), electrically programmable ROM (EPROM), electrically erasable PROM (EEPROM), or flash memory. Volatile memory 1920 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1912 also includes removable/non-removable, volatile/nonvolatile computer storage media. FIG. 19 illustrates, for example a disk storage 1924. Disk storage 1924 includes, but is not limited to, devices like a magnetic disk drive, floppy disk drive, tape drive, Jaz drive, Zip drive, LS-100 drive, flash memory card, or memory stick. In addition, disk storage 1924 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1924 to the system bus 1918, a removable or non-removable interface is typically used such as interface 1926.

It is to be appreciated that FIG. 19 describes software that acts as an intermediary between users and the basic computer resources described in suitable operating environment 1910. Such software includes an operating system 1928. Operating system 1928, which can be stored on disk storage 1924, acts to control and allocate resources of the computer 1912. System applications 1930 take advantage of the management of resources by operating system 1928 through program modules 1932 and program data 1934 stored either in system memory 1916 or on disk storage 1924. It is to be appreciated that one or more embodiments of the subject disclosure can be implemented with various operating systems or combinations of operating systems.

A user enters commands or information into the computer 1912 through input device(s) 1936. Input devices 1936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1914 through the system bus 1918 via interface port(s) 1938. Interface port(s) 1938 include, for example, a serial port, a parallel port, a game port, and a universal serial bus (USB). Output device(s) 1940 use some of the same type of ports as input device(s) 1936. Thus, for example, a USB port may be used to provide input to computer 1912, and to output information from computer 1912 to an output device 1940. Output adapters 1942 are provided to illustrate that there are some output devices 1940 like monitors, speakers, and printers, among other output devices 1940, which require special adapters. The output adapters 1942 include, by way of illustration and not limitation, video and sound cards that provide a means of connection between the output device 1940 and the system bus 1918. It should be noted that other devices and/or systems of devices provide both input and output capabilities such as remote computer(s) 1944.

Computer 1912 can operate in a networked environment using logical connections to one or more remote computers, such as remote computer(s) 1944. The remote computer(s) 1944 can be a personal computer, a server, a router, a network PC, a workstation, a microprocessor based appliance, a peer device or other common network node and the like, and typically includes many or all of the elements described relative to computer 1912. For purposes of brevity, only a memory storage device 1946 is illustrated with remote computer(s) 1944. Remote computer(s) 1944 is logically connected to computer 1912 through a network interface 1948 and then physically connected via communication connection 1950. Network interface 1948 encompasses communication networks such as local-area networks (LAN) and wide-area networks (WAN). LAN technologies include Fiber Distributed Data Interface (I-DDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL). Network interface 1948 can also encompass near field communication (NFC) or Bluetooth communication.

Communication connection(s) 1950 refers to the hardware/software employed to connect the network interface 1948 to the system bus 1918. While communication connection 1950 is shown for illustrative clarity inside computer 1912, it can also be external to computer 1912. The hardware/software necessary for connection to the network interface 1948 includes, for exemplary purposes only, internal and external technologies such as, modems including regular telephone grade modems, cable modems and DSL modems, ISDN adapters, and Ethernet cards.

FIG. 20 is a schematic block diagram of a sample computing environment 2000 with which the disclosed subject matter can interact. The sample computing environment 2000 includes one or more client(s) 2002. The client(s) 2002 can be hardware and/or software (e.g., threads, processes, computing devices). The sample computing environment 2000 also includes one or more server(s) 2004. The server(s) 2004 can also be hardware and/or software (e.g., threads, processes, computing devices). The servers 2004 can house threads to perform transformations by employing one or more embodiments as described herein, for example. One possible communication between a client 2002 and servers 2004 can be in the form of a data packet adapted to be transmitted between two or more computer processes. The sample computing environment 2000 includes a communication framework 2006 that can be employed to facilitate communications between the client(s) 2002 and the server(s) 2004. The client(s) 2002 are operably connected to one or more client data store(s) 2008 that can be employed to store information local to the client(s) 2002. Similarly, the server(s) 2004 are operably connected to one or more server data store(s) 2010 that can be employed to store information local to the servers 2004.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A system for cataloguing smart power and energy devices, comprising:
    a memory that stores computer-executable components; and
    a processor, operatively coupled to the memory, that executes the computer-executable components, the computer-executable components comprising:
        a discovery component configured to discover smart power and energy devices deployed on a network and retrieve, for each device of the smart power and energy devices, device information comprising an identity of the device and identities of data tags available on the device;
        a classification component configured to, for each device of the smart power and energy devices, identify a type of the device, generate a device profile for the device, and classify the device profile according to the type of the device to yield categorized power or energy data;
        a power analytics component configured to perform sequence-of-events analytics on real-time data and historical data retrieved from the data tags of the smart power and energy devices, and to identify a root cause of a circuit breaker trip based on a result of the sequence-of-events analysis; and
        a client interface component configured to:
            generate, in accordance with search input submitted to the system, a first interface display that renders selected sets of the categorized power or energy data categorized according to the types of the devices, and
            generate a second interface display that renders information regarding the root cause of the circuit breaker trip as a map of a facility that includes a graphical indication of a location of the root cause.

2. The system of claim 1, wherein the classification component is configured to classify the device profile according to at least one of a power meter, a variable frequency drive, an intelligent electronic device, an industrial controller with power monitoring capabilities, a motor control center device, or an overload relay.

3. The system of claim 1, wherein
the search input comprises a selection of a type of smart power and energy device, and
the client interface component is configured to render, as the selected sets of the categorized power or energy data, a subset of the categorized power or energy data corresponding to a subset of the smart power and energy devices conforming to the type.

4. The system of claim 1, wherein
the client interface component is configured to render, on the first interface display or the second interface display, selected subsets of the real-time data and the historical data.

5. The system of claim 1, wherein
a subset of the categorized power or energy data comprises values of respective configuration parameters of the smart power and energy devices,
the client interface component is configured to receive, via interaction with the first interface display, configuration data that modifies one or more values of the configuration parameters to yield updated configuration data, and
the system further comprises a device interface component configured to write the updated configuration data to a selected subset of the smart power and energy devices.

6. The system of claim 1, wherein the profile data for each device of the smart power and energy devices comprises at least one of a name of the device, a type of the device, a description of the device, a network address of the device, a version of firmware currently installed on the device, and an update status of the firmware.

7. The system of claim 1, wherein the client interface component is configured to render the selected sets of categorized power or energy data filtered or categorized according to plant facility or production area.

8. The system of claim 1, wherein the client interface component is configured to render the selected sets of the categorized power or energy data as a heat map presentation.

9. A method for collecting and rendering smart power and energy device information, comprising:
  identifying, by a system comprising a processor, sources of power and energy data on a network, wherein the sources comprises at least one of smart power and energy devices or repositories of power and energy data;
  for each source of the sources of power and energy data;
    retrieving, by the system, device information comprising an identity of the source and identities of data items available on the source,
    determining, by the system, a type of the source,
    generating, by the system, a device profile for the source, and
    classifying, by the system, the device profile according to the type of the source to yield categorized power or energy data;
  generating, by the system, a first interface display that renders selected sets of the categorized power or energy data in accordance with search input submitted via the interface display;
  performing, by the system, sequence-of-events analysis on at least a subset of the power and energy data retrieved from the sources of power and energy data;
  identifying, by the system based on a result of the sequence-of-events analysis, a root cause of a circuit breaker trip; and
  generating, by the system, a second interface display that renders information regarding the root cause of the circuit breaker trip as a map of a facility that includes a graphical indication of a location of the root cause.

10. The method of claim 9, wherein the classifying comprises classifying the device profile as at least one of a power meter, a variable frequency drive, an intelligent electronic device, an industrial controller with power monitoring capabilities or data, an overload relay, or a motor control center device.

11. The method of claim 9, further comprising:
  receiving, by the system as the search input, selection of a type of smart power and energy device; and
  rendering, by the system in response to the receiving the selection, a subset of the categorized power or energy data corresponding to a subset of the sources of power and energy data conforming to the type.

12. The method of claim 9, wherein
  the categorized power or energy data comprises live values and historical values retrieved from the data items, and
  the generating the first interface display comprises rendering, on the first interface display, selected subsets of the live and historical values.

13. The method of claim 9, wherein a subset of the data items comprises values of respective configuration parameters of smart power and energy devices, and
  the method further comprises:
    receiving, by the system via interaction with the first interface display, configuration data that changes a value of a configuration parameter, of the configuration parameters, to yield a modified value; and
    downloading, by the system, the modified value to one of the smart power and energy devices corresponding to the configuration parameter.

14. The method of claim 9, wherein the generating the device profile comprises generating the device profile to include at least one of a name of the source, a type of the source, a description of the source, a network address of the source, a version of firmware currently installed on the source, and an update status of the firmware.

15. The method of claim 9, wherein the generating the first interface display comprises rendering the selected sets of the categorized power or energy data filtered or categorized according to industrial facility or production area.

16. A non-transitory computer-readable medium having stored thereon instructions that, in response to execution, cause a system comprising a processor to perform operations, the operations comprising:
  detecting and identifying smart power and energy devices present on a network;
  retrieving device information from the smart power and energy devices, the device information comprising, for each device of the smart power and energy devices, an identity of the device and identities of data items available on the device;
  for each device of the smart power and energy devices:
    determining a type of the device,
    generating a device profile for the device, and
    classifying the device profile according to the type of the device to yield categorized power or energy data;
  rendering a first interface display that displays selected sets of the categorized power or energy data in accordance with search input submitted via interaction with the interface display;
  performing sequence-of-events analysis on at least a subset of data items retrieved from the smart power and energy devices;
  identifying, based on a result of the sequence-of-events analysis, a root cause of a circuit breaker trip; and
  generating, by the system, a second interface display that renders information regarding the root cause of the circuit breaker trip as a map that includes a graphical indication of a location of the root cause within a facility.

17. The non-transitory computer-readable medium of claim 16, wherein the classifying comprises classifying the device profile as at least one of a power monitor, a variable frequency drive, an intelligent electronic device, an industrial controller with power monitoring capabilities, or a motor control center device.

18. The non-transitory computer-readable medium of claim 16, wherein the operations further comprise:
  receiving, as the search input, selection of a type of smart power and energy device; and
  rendering, in response to the receiving the selection, a subset of the categorized power or energy data corresponding to a subset of the smart power and energy devices conforming to the type.

19. The non-transitory computer-readable medium of claim 16, wherein the generating the device profile comprises generating the device profile to include at least one of a name of the device, a type of the device, a description of the device, a network address of the device, a version of firmware currently installed on the device, and an update status of the firmware.

20. The system of claim 1, wherein the power analytics component is configured to, as part of the sequence-of-events analytics, analyze historical device status information for a selected subset of the smart power and energy devices and time-series voltage or time-series current values measured by one or more of the smart power and energy devices.

* * * * *